(12) United States Patent
Akselrod

(10) Patent No.: US 11,037,973 B2
(45) Date of Patent: *Jun. 15, 2021

(54) OPTICAL SURFACE-SCATTERING ELEMENTS AND METASURFACES

(71) Applicant: Elwha, LLC, Bellevue, WA (US)

(72) Inventor: Gleb M Akselrod, Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 528 days.

This patent is subject to a terminal disclaimer.

(21) Appl. No.: 15/900,676

(22) Filed: Feb. 20, 2018

(65) Prior Publication Data
US 2018/0241131 A1 Aug. 23, 2018

Related U.S. Application Data

(60) Provisional application No. 62/462,105, filed on Feb. 22, 2017.

(51) Int. Cl.
*H01Q 15/00* (2006.01)
*H01L 27/146* (2006.01)
(Continued)

(52) U.S. Cl.
CPC .. *H01L 27/14625* (2013.01); *B29D 11/00326* (2013.01); *B82Y 20/00* (2013.01);
(Continued)

(58) Field of Classification Search
CPC .. G02F 1/292; G02F 1/13342; G02F 2202/30; G02F 2202/36; G02F 2202/103;
(Continued)

(56) References Cited

U.S. PATENT DOCUMENTS 9,040,428 B2  5/2015 Hong et al.
9,195,052 B2  11/2015 Long et al.
(Continued)

FOREIGN PATENT DOCUMENTS

WO  WO 2018-039455 A1  3/2018

OTHER PUBLICATIONS

PCT International Search Report; International App. No. PCT/US2019/022935; dated Jul. 4, 2019; pp. 1-5.
(Continued)

*Primary Examiner* — Tho G Phan

(57) ABSTRACT

Systems and methods are described herein for an optical beam-steering device that includes an optical transmitter and/or receiver to transmit and/or receive optical radiation from an optically reflective surface. An array of adjustable dielectric resonator elements is arranged on the surface with inter-element spacings less than an optical operating wavelength. A controller applies a pattern of voltage differentials to the adjustable dielectric resonator elements. The pattern of voltage differentials corresponds to a sub-wavelength reflection phase pattern for reflecting the optical electromagnetic radiation. One embodiment of a dielectric resonator element includes first and second dielectric members extending from the surface. The dielectric resonator elements are spaced from one another to form a gap or channel therebetween. A voltage-controlled adjustable refractive index material is disposed within the gap.

42 Claims, 20 Drawing Sheets

(51) Int. Cl.

| | | |
|---|---|---|
| G02F 1/29 | (2006.01) | |
| G02B 5/18 | (2006.01) | |
| G03H 1/04 | (2006.01) | |
| H04N 5/225 | (2006.01) | |
| H04N 5/374 | (2011.01) | |
| B29D 11/00 | (2006.01) | |
| B82Y 20/00 | (2011.01) | |
| G03H 1/02 | (2006.01) | |
| H01Q 1/38 | (2006.01) | |
| H01Q 3/44 | (2006.01) | |
| H01Q 15/02 | (2006.01) | |
| H01Q 15/14 | (2006.01) | |
| G01S 17/89 | (2020.01) | |
| G01S 7/481 | (2006.01) | |
| G01S 17/10 | (2020.01) | |
| G01S 17/42 | (2006.01) | |
| G02F 1/01 | (2006.01) | |
| G02F 1/1339 | (2006.01) | |
| G02F 1/1341 | (2006.01) | |
| H01J 37/317 | (2006.01) | |
| H01J 37/32 | (2006.01) | |
| G03H 1/00 | (2006.01) | |
| G02F 1/1334 | (2006.01) | |
| G03F 7/20 | (2006.01) | |
| G02B 6/122 | (2006.01) | |

(52) U.S. Cl.
CPC .......... *G01S 7/4813* (2013.01); *G01S 7/4817* (2013.01); *G01S 17/10* (2013.01); *G01S 17/42* (2013.01); *G01S 17/89* (2013.01); *G02B 5/1809* (2013.01); *G02F 1/0107* (2013.01); *G02F 1/1339* (2013.01); *G02F 1/1341* (2013.01); *G02F 1/292* (2013.01); *G03H 1/00* (2013.01); *G03H 1/0244* (2013.01); *G03H 1/0443* (2013.01); *H01J 37/3174* (2013.01); *H01J 37/32816* (2013.01); *H01L 27/14643* (2013.01); *H01Q 1/38* (2013.01); *H01Q 3/44* (2013.01); *H01Q 15/002* (2013.01); *H01Q 15/0066* (2013.01); *H01Q 15/02* (2013.01); *H01Q 15/148* (2013.01); *H04N 5/2253* (2013.01); *H04N 5/374* (2013.01); *G02B 6/1226* (2013.01); *G02F 1/13342* (2013.01); *G02F 2202/103* (2013.01); *G02F 2202/30* (2013.01); *G02F 2202/36* (2013.01); *G03F 7/2041* (2013.01); *G03F 7/2059* (2013.01); *G03H 2240/13* (2013.01); *H01J 2237/334* (2013.01)

(58) Field of Classification Search
CPC .... G02F 1/0107; G02F 1/1339; G02F 1/1341; B29D 11/00326; B82Y 20/00; G01S 7/4817; G01S 7/4813; G01S 17/10; G01S 17/42; G01S 17/89; H01L 27/14625; H01L 27/14643; H04N 5/2253; H04N 5/374; G02B 6/1226; G02B 5/1809; G03F 7/2041; G03F 7/2059; G03H 2240/13; G03H 1/00; G03H 1/0244; G03H 1/0443; H01J 2237/334; H01J 37/3174; H01J 37/32816; H01Q 1/38; H01Q 3/44; H01Q 15/002; H01Q 15/0066; H01Q 15/02; H01Q 15/148; H01Q 15/00; H01Q 15/14
See application file for complete search history.

(56) References Cited

U.S. PATENT DOCUMENTS

| | | |
|---|---|---|
| 9,804,329 B2 | 10/2017 | Montazeri et al. |
| 9,865,640 B2* | 1/2018 | Fenigstein ........ H01L 27/14685 |
| 10,056,683 B2* | 8/2018 | Sharawi ................ H01Q 1/243 |
| 10,254,448 B2* | 4/2019 | Lee ......................... G02B 5/008 |
| 10,303,038 B2 | 5/2019 | Kim et al. |
| 10,340,599 B2* | 7/2019 | Tayfeh Aligodarz ........................ H01Q 15/0066 |
| 10,451,800 B2 | 10/2019 | Akselrod |
| 10,461,434 B2* | 10/2019 | Smith .................... H01Q 15/04 |
| 10,627,571 B1 | 4/2020 | Akselrod |
| 10,665,947 B2* | 5/2020 | Pance ................ H01Q 21/0075 |
| 10,670,782 B2 | 6/2020 | Arbabi |
| 10,938,115 B2* | 3/2021 | Urzhumov ............. H01Q 3/46 |
| 2002/0081445 A1 | 6/2002 | Kadomura et al. |
| 2003/0174940 A1 | 9/2003 | Charlton et al. |
| 2004/0037497 A1 | 2/2004 | Lee |
| 2004/0125266 A1 | 7/2004 | Miyauchi et al. |
| 2005/0117866 A1 | 6/2005 | Park et al. |
| 2006/0044212 A1* | 3/2006 | Wang ....................... H01Q 3/44 343/911 R |
| 2006/0202125 A1 | 9/2006 | Suhami |
| 2006/0239688 A1* | 10/2006 | Hillis ..................... B82Y 20/00 398/116 |
| 2006/0284187 A1 | 12/2006 | Wierer, Jr. et al. |
| 2007/0013983 A1 | 1/2007 | Kitamura et al. |
| 2009/0067774 A1 | 3/2009 | Magnusson |
| 2011/0134496 A1 | 6/2011 | Tompkin et al. |
| 2011/0244613 A1 | 10/2011 | Heck et al. |
| 2012/0194399 A1 | 8/2012 | Bily |
| 2012/0267694 A1 | 10/2012 | Kaiser et al. |
| 2013/0129293 A1 | 5/2013 | Ogawa et al. |
| 2014/0038320 A1 | 2/2014 | Wang |
| 2014/0085693 A1 | 3/2014 | Mosallaei et al. |
| 2014/0266946 A1 | 9/2014 | Bily |
| 2014/0294338 A1 | 10/2014 | Long et al. |
| 2015/0036198 A1 | 2/2015 | Inokuchi |
| 2015/0162658 A1 | 6/2015 | Bowers et al. |
| 2015/0318618 A1 | 11/2015 | Chen |
| 2015/0318620 A1 | 11/2015 | Black |
| 2015/0372389 A1 | 12/2015 | Chen |
| 2015/0380828 A1 | 12/2015 | Black |
| 2017/0153528 A1 | 6/2017 | Kim et al. |
| 2018/0047774 A1 | 2/2018 | Garreau et al. |
| 2018/0241131 A1 | 8/2018 | Akselrod |
| 2019/0006533 A1 | 1/2019 | Goldan et al. |
| 2019/0243208 A1 | 8/2019 | Peng et al. |
| 2019/0294104 A1 | 9/2019 | Rho et al. |
| 2019/0377084 A1 | 12/2019 | Sleasrnan et al. |
| 2020/0412005 A1* | 12/2020 | Olk ........................... G01S 7/02 |

OTHER PUBLICATIONS

PCT International Search Report; International App. No. PCT/US2018/019107; dated Jun. 25, 2018; pp. 1-3.
Huang et al., "Gate-tunable conducting oxide metasurfaces," Nano Lett. 16, 5319 (2016).
Pors, Bozhevolnyi, "Plasmonic metasurfaces for efficient phase control in reflection," Opt. Express 21, 27438 (2013).
Arbabi, Horie, Ball, Bagheri, Faraon, "Subwavelength-thick lenses with high numerical apertures and large efficiency based on high contrast transmitarrays," Nat. Commun. 6, 1 (2014).
Haffner et al., "All-plasmonic Mach—Zehnder modulator enabling optical high-speed communication at the microscale." Nat. Photonics 9, 525-528 (2015).
Li et al., "Poling efficiency enhancement of tethered binary nonlinear optical chromophores for achieving an ultrahigh n3r33 figure-of-merit of 2601 pm V?1" J. Mater. Chem. C 3, 6737-6744 (2015).
Zhang et al., "High performance optical modulator based on electro-optic polymer filled silicon slot photonic crystal waveguide," J. Light. Technol. 34, 2941-2951 (2016).
Xing et al., "Digitally controlled phase shifter using an SOI slot waveguide with liquid crystal infiltration," 27, 1269-1272 (2015).

(56) References Cited

OTHER PUBLICATIONS

Borshch, Shiyanovskii, and Lavrentovich, "Nanosecond electro-optic switching of a liquid crystal," Phys. Rev. Lett. 111, 107802 (2013).
Chen et al., "Ultra-low viscosity liquid crystal materials," Opt. Mater. Express 5, 655 (2015).
Gholipour, Zhang, MacDonald, Hewak, and Zheludev, "An all-optical, non-volatile, bidirectional, phase-change meta-switch," Adv. Mater 25, 3050 (2013).
Raoux, Xiong, Wuttig, and Pop, "Phase change materials and phase change memory," MRS Bull. 39, 703 (2014).
Rios, et al., "Integrated all-photonic non-volatile multi-level memory," Nat. Photonics 9, 725 (2015).
Requirement for Restriction/Election, U.S. Appl. No. 15/900,683, dated Jul. 28, 2020, pp. 1-9.
Funkhouser, T. et al., 'Survey of Methods for Modeling Sound Propagation in Interactive Virtual Environment Systems', Princeton University, Department of Computer Science, pp. 1-53, 2003.

* cited by examiner

OPTICAL SURFACE-SCATTERING ELEMENTS AND METASURFACES

If an Application Data Sheet (ADS) has been filed on the filing date of this application, it is incorporated by reference herein. Any applications claimed on the ADS for priority under 35 U.S.C. §§ 119, 120, 121, or 365(c), and any and all parent, grandparent, great-grandparent, etc., applications of such applications are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 U.S.C. § 119(e) for provisional patent applications, and for any and all parent, grandparent, great-grandparent, etc., applications of the Priority Application(s)). In addition, the present application is related to the "Related Applications," if any, listed below.

PRIORITY APPLICATIONS

This application claims priority under 35 U.S.C. § 119 to U.S. Provisional Patent Application No. 62/462,105 filed on Feb. 22, 2017, titled "Optical Surface Scattering Antennas," which is hereby incorporated by reference in its entirety. Moreover, each reference described and/or identified in the provisional application is also hereby incorporated by reference in its entirety.

RELATED APPLICATIONS

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc., applications of the Priority Applications and the Related Applications, including any priority claims, is incorporated herein by reference to the extent such subject matter is not inconsistent herewith.

TECHNICAL FIELD

This disclosure relates to reconfigurable antenna technology. Specifically, this disclosure relates to reconfigurable reflective-type antenna elements operable at optical frequencies.

DETAILED DESCRIPTION

Figure 1A:
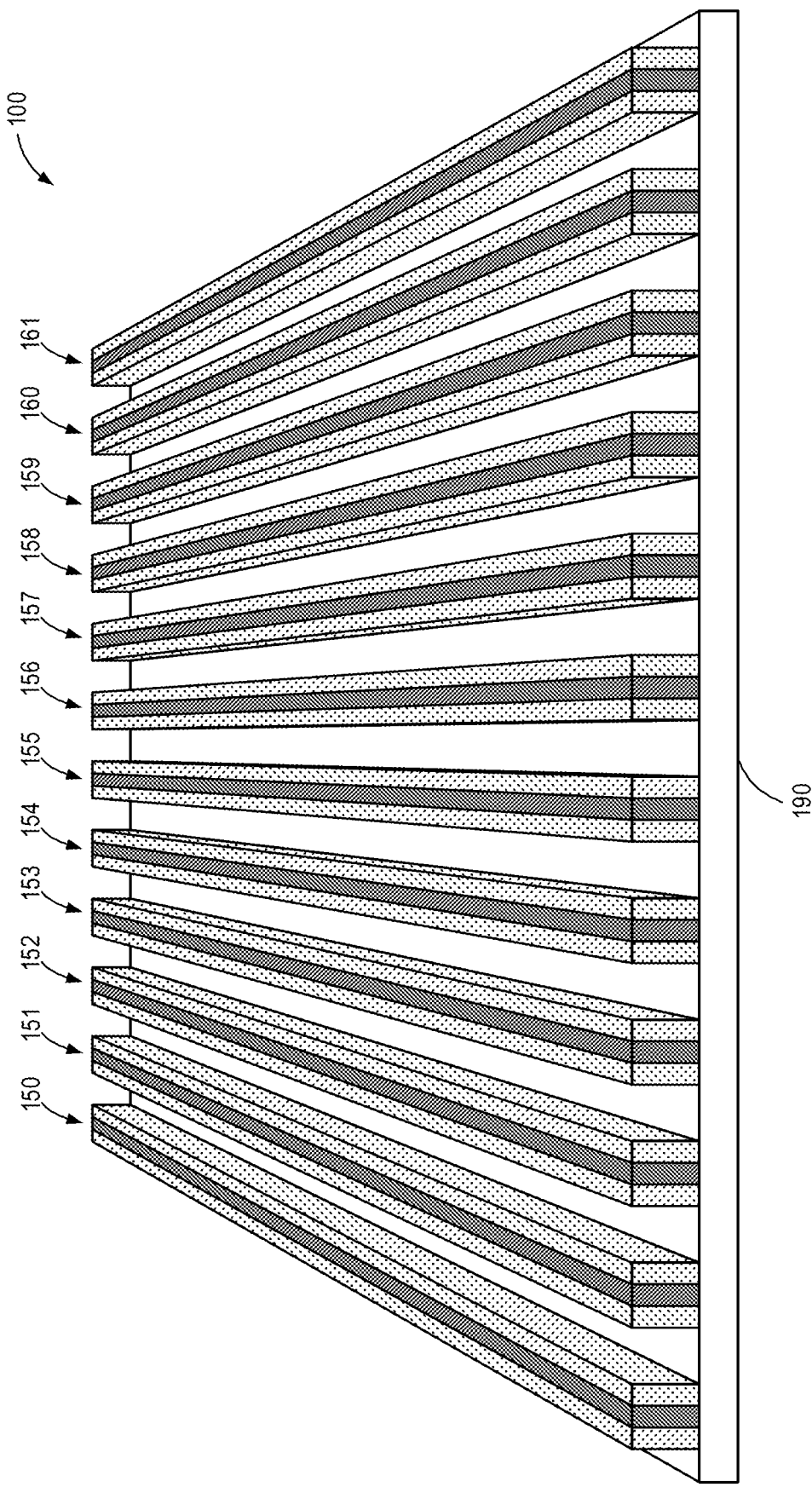
FIG. 1A illustrates a simplified embodiment of an optical surface scattering antenna device with pairs of elongated dielectric members with adjustable refractive index material therebetween forming dielectric resonator elements.

In various embodiments, reconfigurable antennas leverage metamaterial surface antenna technology (MSAT). Metamaterial surface antennas, also known as surface scattering antennas and Metasurface antennas, are described, for example, in U.S. Patent Publication No. 2012/0194399, which publication is hereby incorporated by reference in its entirety. Additional elements, applications, and features of surface scattering antennas that feature a reference wave or feed wave are described in U.S. Patent Publication Nos. 2014/0266946, 2015/0318618, 2015/0318620, 2015/0380828 and 2015/0372389, each of which is hereby incorporated by reference in its entirety. Examples of related systems that utilize a free-space reference or feed wave are described in, for example, U.S. Patent Publication No. 2015/0162658, which application is also hereby incorporated by reference in its entirety.

Systems and methods described herein utilize a free-space feed configuration to illuminate a reflective surface. The reflective surface is populated with adjustable scattering elements. It is appreciated that, throughout the disclosure, for each disclosed embodiment that involves illuminating a surface with a free-space reference wave to provide a reflecting outgoing or transmitted wave having a specific field pattern, a reciprocal embodiment is also contemplated that involves reflecting an incoming or received wave from the surface and then detecting the reflected wave according to the same specific field pattern. More generally, antenna systems and methods described herein may be used to transmit and receive via the same device (transceive), transmit only, receive only, or transmit via one device and receive via a separate but similar device. For the sake of brevity, such devices and methods may be described as only transmitting or only receiving with the understanding that other combinations of receiving and/or transmitting are contemplated.

The presently-described systems and methods operate at higher frequencies than many of the publications described above. Specifically, the systems and methods described herein operate in at least the infrared and/or visible frequencies. As used herein, near-infrared, infrared, visible, and near ultraviolet frequencies may be generally referred to as "optical" frequencies and wavelengths. When operational frequencies are scaled up to optical frequencies, the sizes of the individual scattering elements and the spacings between adjacent scattering elements are proportionally scaled down to preserve the subwavelength (e.g., metamaterial) aspect of the technology. The relevant length scales for operation at optical frequencies may be on the order of microns or smaller. Generally, the feature sizes are smaller than typical length scales for conventional printed circuit board (PCB) processes. Accordingly, many of the embodiments of the present disclosure may be manufactured using micro- and/or nano-lithographic processes, such as complementary metal-oxide-semiconductor (CMOS) lithography, plasma-enhanced chemical vapor deposition (PECVD), reactive ion etching, and the like.

Similarly, while many of the publications described above utilize metallic structures with resonances suitable for radio frequencies (e.g., microwaves), such metallic structures become increasingly lossy with increasing frequencies. Accordingly, the present systems and methods utilize substantially different structures formed from dielectrics having primarily dielectric resonances.

Various applications of an optical surface scattering antenna as described herein include, but are not limited to, imaging via light detection and ranging (LiDAR), imaging via structured illumination, free-space optical communication (e.g., single-beam and multiple-input-multiple-output (MIMO) configurations), and pointing and tracking for free-space optical communications.

In various embodiments, a reconfigurable antenna aperture is populated with high-quality factor (high-Q) optical resonators. Modest changes in the dielectric constant of a high-Q optical resonator result in a substantial shift in the resonant wavelength(s) of the high-Q optical resonator. The higher the Q factor, the greater the shift in resonance for a given change in the dielectric constant. Assuming a fixed frequency of operation near the resonance of the resonator, a scattered field from the resonator may vary in phase and/or amplitude as a function of the tuned dielectric value of the resonator. Although the phase and amplitude are correlated through the Lorentzian resonance, the phase of the field over the aperture may be used for holographic and/or beam-forming designs. The systems and methods described below allow for considerable control without additionally introduced phase-shifters.

The index modulation range of tunable dielectric material is limited based on material selection. An antenna aperture with an array of tunable radiating or scattering elements may have high-Q, low-loss, subwavelength resonators. Plasmonic resonators based on a patch antenna geometry represent one possible approach where the tunability is enabled by an accumulation layer at a conductor-dielectric interface. However, the low-Q of the plasmonic resonators and high absorption of the plasmonic mode results in a poor reflection efficiency. The loss in plasmonic patch antennas can be reduced by reducing the Q-factor, but this decreases tunability.

In various embodiments, tunable resonators for scattering and/or radiating are described herein that have a high-Q, are low-loss, and are sufficiently tunable to provide full or near-full phase control. As a specific example, a surface may be configured with a plurality of adjustable dielectric resonator elements. The inter-element spacing of the adjustable dielectric resonator elements may be less than, for example, an optical operating wavelength within an operational bandwidth. The surface may include an optically reflective surface to reflect optical electromagnetic radiation within the operational bandwidth.

In one embodiment, one or more of the adjustable dielectric resonator elements may include a first dielectric member extending from the surface and a second dielectric member extending from the surface. An adjustable refractive index material may be disposed in a gap between the first and second dielectric members to form a dielectric resonator element. The dielectric resonator element can be tuned or adjusted by adjusting the adjustable refractive index material.

The first and second dielectric members may be elongated, pillar-shaped, rounded, squared, etc. In some embodiments, elongated dielectric members may extend from the surface as walls or ridges (e.g., perpendicular to the surface or at an angle relative to the surface). The walls or ridges may run between two ends or edges of the surface. For example, a first dielectric member may be formed as a first elongated wall, the second dielectric member may be formed as a second elongated wall that is substantially parallel to the first wall, and the adjustable refractive index material may be disposed within a channel defined by the first and second walls.

The first and second dielectric members may, alternatively, be formed as a pair of pillars (e.g., a first pillar and a second pillar). Pairs of pillars may, for example, be arranged as an N×M array of pairs of pillars, where N and M are integers greater than 1. An adjustable refractive index material may be disposed between the first and second pillars in each pair of pillars.

In some embodiments, each dielectric resonator element may include first and second dielectric members extending from the surface. The first and second dielectric members may be elongated and spaced to form a channel therebetween. An electrically adjustable refractive index material may be disposed within the channel. A variable voltage differential may be applied to the first and second dielectric members. The refractive index of the adjustable refractive index material may be varied based on an applied voltage differential. Each voltage differential may correspond to a different refractive index, and each refractive index may correspond to a unique reflection phase of the dielectric resonator element.

In various embodiments, the surface may comprise an optically reflective and electrically conductive surface, such as a metal surface. As a specific example, the surface may comprise or include patches of copper. In some embodiments, the patches of copper are strategically positioned beneath each dielectric resonator element on a substrate. The substrate may be optically transparent or absorb most of the energy at wavelengths within the operational bandwidth. In some embodiments, the substrate may be substantially covered with a reflective metal. The material may depend on the operational bandwidth and/or other desired properties of reflectivity. Examples of suitable metals for various operational bandwidths include copper, silver, gold, nickel, iridium, aluminum, etc. In some embodiments, reflective patches or reflective coatings on the substrate may be formed as high-reflective patches or coatings with more than one layer of material (e.g., a first layer with a high index of refraction and a second layer with a low index of refraction).

As previously noted, the substrate may be entirely covered with a reflective material. In other embodiments, the substrate itself may comprise the reflective material (e.g., the dielectric pillars or walls extend from a copper plate). In other embodiments, patches of reflective material with dimensions corresponding to the dimensions of each dielectric resonator element are positioned substantially beneath each dielectric resonator element. In some embodiments, a non-conductive layer (e.g., silicon dioxide) may separate the reflective patch or layer (which may be electrically conductive) from the dielectric members and adjustable refractive index material that form each dielectric resonator element.

The arrangement of dielectric resonator elements on the surface may be described as a metasurface with each dielectric resonator element functioning as a metamaterial device with sub-wavelength proportions for the operational bandwidth. Accordingly, the inter-element spacing between adjacent dielectric resonator elements is generally less than one wavelength of a smallest wavelength within the operational bandwidth (e.g., three-quarters of a wavelength or one-half of a wavelength). In some embodiments, the inter-element spacing may be significantly less than one-half wavelength (e.g., one-fifth, one-tenth, or even less).

In the elongated wall embodiment described above, the dielectric resonator elements may be arranged in a one-dimensional array defined perpendicular to the elongated walls that extend from one end or edge of the surface to another end or edge of the surface. In some embodiments, the one-dimensional array of walls may be formed on a surface without both edges, or even one edge, of the wall extending to the edge of the surface. In some embodiments, substantially elongated walls may be arranged substantially parallel to one another with adjustable refractive index material disposed therebetween. In some embodiments, the adjustable refractive index material is disposed between every adjacent elongated, substantially parallel wall. In other embodiments, pairs of elongated walls may be closer to each other than adjacent, non-pair elongated walls. The adjustable refractive index material may only be disposed between paired elongated walls. Pairs of elongated walls may be arranged in an N×M array on the surface, where N and M are each an integer larger than one.

The resonance of each dielectric resonator element may depend on the height, width, and/or length of each dielectric wall. Accordingly, one or more of the dimensions of the dielectric wall may selected to attain a target operational bandwidth, target resonance bandwidth, target Q factor for the dielectric resonator element, and/or other functionality.

To provide a specific example, an elongated wall may extend from the surface to a height of between approximately 300 and 1500 nanometers. For example, the elongated wall may extend from the surface to a height of 300 nanometers in one embodiment. In another embodiment, the elongated wall may extend from the surface to a height of 500 nanometers. In still other embodiments, walls elongated walls exceeding 1500 nanometers may be used. The exact height of the elongated walls may be adapted for a particular frequency or frequency band and/or to attain various target resonant characteristics as discussed below.

Each of the elongated walls may have a width between approximately 50 and 300 nanometers. As an example, each of the elongated walls may have a width of approximately 100 nanometers. Each elongated wall may be spaced from each adjacent elongated wall by between approximately 40 and 250 nanometers. The spacing between elongated walls may be uniform, patterned, random, or pseudorandom. In various embodiments, each of the elongated walls is spaced from each adjacent elongated wall by distances between approximately 40 and 80 nanometers. That is, each of the elongated walls may be uniformly spaced from each adjacent elongated wall by a spacing distance that is between approximately 40 and 80 nanometers, or each of the elongated walls may be unevenly spaced from adjacent elongated walls by distances between approximately 40 and 80 nanometers.

In some embodiments, each discrete pair of elongated walls with adjustable refractive index material therebetween form a dielectric resonator element. As a specific example of such an embodiment, 100 elongated walls may be paired as part of 50 dielectric resonator elements. The spacing between paired elongated walls may be less than the spacing between adjacent, but non-paired elongated walls. Adjustable refractive index material may be disposed between all of the elongated walls, or only between paired elongated walls.

In some embodiments, some or all of the dielectric resonator elements may share an elongated wall with another of the dielectric resonator elements. In the extreme example, dielectric elements at the ends of a row of dielectric resonator elements (i.e., a one-dimensional array of dielectric resonator elements) share only one elongated wall while all of the other dielectric resonator elements share both elongated walls. In such an embodiment, 100 elongated walls arranged substantially parallel to one another may be paired to form 99 dielectric resonator elements in a one-dimensional array.

Regardless of the configuration or arrangement of elongated walls, the height and width dimensions of each of the elongated walls may be based on a target resonance and/or Q factor for a wavelength or wavelengths within the operational bandwidth. In one specific embodiment, each of the elongated walls extends from the optically reflective surface to a height between approximately 400 and 600 nanometers, has a width between approximately 80 and 120 nanometers, and a spacing between paired elongated walls is between 40 and 80 nanometers. In such an embodiment, the distance between dielectric resonator elements may be less than one wavelength of the largest operational frequency. Thus, for an operational bandwidth that includes infrared light near the visible spectrum, the spacing between dielectric resonator elements (i.e., the spacing between non-paired elongated walls) may be less than approximately 350 nanometers.

For an operational bandwidth deeper into the infrared spectrum, the spacing between dielectric resonator elements may be less than approximately 500 nanometers. For an operational bandwidth that includes blue light, the width, height, and spacing between paired elongated walls may be adjusted for a target resonance and Q factor. Moreover, the spacing between dielectric resonator elements for an operational bandwidth that includes blue light may be less than approximately 225 nanometers.

While the above-described embodiments contemplate a one-dimensional array of elongated walls on a surface, in some embodiments, the elongated walls may be arranged in any number of columns having any number of rows to form an M×N array of dielectric resonator elements, with shared or unshared elongated walls. A matrix of circuitry may be utilized to selectively address each of the dielectric resonator elements to supply a voltage differential between paired elongated walls. In still other embodiments, the elongated walls may be arranged in concentric rings or as concentric sides of a polygon. For example, the elongated walls may be curved, such that the concentric rings are circular. Alternatively, the elongated walls may be straight and arranged as concentric sides of a polygon such as a hexagon, octagon, or the like.

Many of the above-described embodiments contemplate dielectric resonator elements that are each formed by a pair of elongated walls (shared or unshared) with an adjustable refractive index material disposed therebetween. In other embodiments, dielectric resonator elements may be formed by a pair of pillars with adjustable refractive index material disposed therebetween. For example, the pillars may have substantially rectangular bases that are not generally elongated. The rectangular base of each pillar may be square or have a length that is only one to three times the width of the base. Similar to previously described embodiments, each dielectric resonator element may comprise two distinct (i.e., unshared) pillars that form a pair of pillars with an adjustable refractive index material disposed therebetween. In other embodiments, pillars may be shared by one or more neighboring dielectric resonator elements.

In an M×N array of pillars where M and N are each greater than two, some pillars may be shared by four dielectric resonator elements. As a specific example, five pillars having substantially square bases may be arranged with adjustable refractive index material therebetween to form four dielectric resonator elements.

In some embodiments, the dielectric pillars may have substantially rectangular bases, but the sides may be flared in or out slightly. In some embodiments, the bases may be referred to as being substantially rectangular, but actually have a rhombus-shaped base. In some embodiments, the base of each pillar may be the same or a different shape than the top of each pillar, the walls may be planar or may be slightly convex or concave. In some embodiments, the base of each pillar may be slightly larger or smaller than the top of each pillar, such that each pillar may be shaped like a truncated pyramid or an inverted truncated pyramid. Such variations in shape may, in some instances, be a product of manufacturing or etching. For example, an attempt to create rectangular bases using chemical etching of a dielectric material may result in slightly malformed pillars with rounded edges and bases and tops that may not have the same area. In many embodiments, the pillars or elongated walls extend substantially perpendicular from the surface, but in other embodiments they may extend at an angle or at various angles based on a desired functionality of the array.

Similar to previous embodiments, the length, height, and width of each of the pillars may be selected to attain a target resonance and/or Q factor for one or more wavelengths within an operational bandwidth. As a specific example, a dielectric resonator element may be formed by two pillars that extend from a surface to a height of approximately 800 nanometers, have a width between approximately 100 nanometers, and a length between approximately 225 nanometers. The exact heights, widths, and lengths of the dielectric resonator elements may be adapted for a particular application, target resonance, target Q factor, functional bandwidth, or other characteristic response. In various embodiments, dielectric resonator elements may be formed by two pillars that extend from a surface to a height between approximately 300 and 1500 nanometers, have a width between approximately 50 and 300 nanometers, and have a length between approximately 150 and 2000 nanometers.

The paired pillars may be spaced from one another by a distance of approximately 50 to 300 nanometers and an adjustable refractive index material may be disposed therebetween. An M×N array (where M and N are positive integers) of such dielectric resonator elements may be formed with spacings between the various dielectric resonator elements being between approximately 50 and 500 nanometers apart.

Whether each dielectric resonator element in an array of dielectric resonator elements is formed by two pillars or two elongated walls, a resonance and a Q factor may be selected for a particular frequency band. Each of the plurality of dielectric resonator elements may be configured as a high-Q dielectric resonator element with a Q factor between approximately 10 and 100.

For instance, each of the plurality of dielectric resonator elements may comprise a high-Q dielectric resonator element with a Q factor between approximately 10 and 30. For example, each of the plurality of dielectric resonator elements may be configured as a high-Q dielectric resonator element with a Q factor of approximately 20.

The spacing gap between the dielectric members (i.e., the pillars or walls) of a dielectric resonator element may correspond to the fundamental harmonic mode of the frequencies within an optical operating bandwidth. In such an embodiment, one antinode can be realized in the distance between the gap. The height of the dielectric members may correspond to the fundamental harmonic mode of frequencies within the optical operating bandwidth, such that one antinode can be realized vertically within the gap.

Alternatively, the height of the dielectric members may be selected to correspond to the second order harmonic mode, such that two antinodes can be realized within the gap between the surface and the tops of the dielectric members. Similarly, the length of the parallel faces of the dielectric members (whether pillars or elongated walls) can be selected to correspond to the fundamental harmonic mode (probably a pillar embodiment) or many harmonic orders (an elongated wall). Thus, the total number of antinodes that can be formed within the adjustable refractive index material between two dielectric members is a function of the gap spacing, the vertical height from the surface, and the length of the dielectric members.

Any combination of heights, gap spacings, and lengths can be selected to attain fundamental, second order, third order . . . etc. harmonic modes in the given dimension. To further illustrate the point, the first and second dielectric members may extend from the surface to a height corresponding to an Nth order harmonic mode of frequencies within an optical operating bandwidth, such that N antinodes can be realized within the gap between the surface and tops of the dielectric members forming the dielectric resonator element.

In various embodiments, the dielectric members may be electromagnetically transparent within the operational bandwidth. In many embodiments, the dielectric members have a static or substantially static index of refraction for each corresponding wavelength within the operational bandwidth.

In various embodiments, the phase of the reflected electromagnetic radiation (e.g., optical radiation) is dependent on the refractive index of the adjustable refractive index material disposed between pairs of dielectric members. The refractive index of the adjustable refractive index material is selected based on a bias voltage applied to one or both dielectric members to create a voltage difference across the adjustable refractive index material.

A controller may be used to selectively apply voltage differentials to the individual or groups of dielectric resonator elements in an array. A pattern of voltage differentials applied to an array of dielectric resonator elements corresponds to a pattern of indices of refraction of the dielectric resonator elements, which in turn corresponds to a pattern of reflection phases of the dielectric resonator elements. Due to the subwavelength spacing and element sizes of the dielectric resonator elements, a pattern of reflection phases of the dielectric resonator elements corresponds to a specific reflection pattern of incident optical radiation. Thus, a set of patterns of applied voltage differentials corresponds to a set of reflection patterns of incident optical radiations. An applied voltage differential pattern can be determined for optical beamforming in both transmit and receive applications. A target beamform can be attained by applying a determinable pattern of voltage differentials to the individual or groups of dielectric resonator elements.

An example of a suitable adjustable refractive index material is liquid crystal. In one specific embodiment, a voltage differential can be varied between a first (low) voltage and a second (higher) voltage to vary the index of refraction of the liquid crystal by approximately ten percent. Another suitable material for some applications is an electro-optic polymer. Electro-optic (EO) polymer materials exhibit a refractive index change based on second order polarizability, known as the Pockels effect, where the index modulation is proportional to the applied static or radio frequency electric field. These materials are typically small molecule organics doped into a polymer host, which results in excellent solution processability. The index modulation is given by $$\Delta n = \tfrac{1}{2} n^3 r_{33} E \qquad \text{Equation 1}$$

In Equation 1, n is the linear refractive index, E is the applied electric field and $r_{33}$ is the Pockels coefficient. Since the electric field is limited by dielectric breakdown, the goal of synthetic chemistry and materials development is to increase the Pockels coefficient. State-of-the-art materials have Pockels coefficients of ~150 pm/V, resulting in a performance of $\Delta n/n$ of approximately 2%. More exotic and recently-developed chemistries have resulted in electro-optical polymers which could potentially achieve index modulation as large as 6%. Since the effect is due to a nonlinear polarizability, the response time of electro-optical polymers is extremely fast (several fs), resulting in device modulation speeds of >40 GHz. Due to their large nonlinear coefficients compared with electro-optic crystalline materials, such as lithium niobate, electro-optical polymers may be used as modulators, enabling high-density photonic integrated circuits.

A number of companies have commercialized the synthesis of electro-optical materials and their integration into Mach-Zender modulators, such as Lightwave Logic and Soluxra. As a result, many challenges associated with electro-optical polymers have been addressed, such as thermal stability, long-term operation, and the efficient poling (orientation) of the nonlinear molecules along the electric field direction. As a result, electro-optical materials can be used as an adjustable refractive index material in some applications. In some approaches, electro-optical polymers may be suitable for applications where MHz and GHz rate switching may be desired, such as LiDAR single-beam scanning and structured illumination, or free-space optical communications with holograms that simultaneously perform beamforming and data encoding (thus allowing multi-user MIMO schemes).

As previously noted, liquid crystals may be used as an adjustable refractive index material in some embodiments as well. Liquid crystals are a wide class of organic materials that exhibit anisotropy in the refractive index, which depends on molecular orientation and is controlled with an alternating current electric field. In the widely-used nematic liquid crystals, modulation between the extraordinary and ordinary refractive index can be up to 13%, exceeding the performance of electro-optical polymers. However, because the index modulation occurs due to physical reorientation of the entire molecule, the switching times in typical liquid crystal devices such as displays are relatively slow (~10 millisecond), limited by the rotational viscosity and the elastic constant of the liquid. As compared to micro-scale displays, the switching time of liquid crystals can be significantly reduced in geometries with smaller electrode spacing and materials optimized for low viscosity, such that microsecond switching times are possible in metasurface structures. The switching time is mostly limited by the on-to-off transition due to elastic relaxation, and consequently device geometries employing orthogonal electrodes can reduce the switching times even further.

The ubiquity of liquid crystal materials, their industrial production, and their robustness are major advantages of liquid crystals for use with dynamic optical metasurfaces. In some approaches, a liquid crystal material having a relatively low switching speed may be suitable to provide dynamic holograms for free-space optical communications, where the optical beam may be steered on the time scale of transmitter and receiver motion and vibration, typically on the millisecond timescale. In other approaches, a liquid crystal material having a relatively high switching speed (e.g. as enhanced by the use of low viscosity liquid crystals and/or counter-electrode geometries) may be suitable for scanning LiDAR and/or computational imaging based on structured illumination where MHz speeds may be desired.

In still other embodiments, one or more types of chalcogenide glasses may be used as the adjustable refractive index material. Chalcogenide glasses have a unique structural phase transition from the crystalline to the amorphous phase—which have strikingly different electrical and optical properties—with index modulation in the shortwave infrared spectrum of over 30%.

The phase transition of chalcogenide glasses is thermally induced and may be achieved through direct electrical heating of the chalcogenide. One example is $Ge_2Sb_2Te_5$ (GST), which becomes crystalline at ~200° C. and can be switched back to the amorphous state with a melt-quenching temperature of ~500° C. In addition to the large index modulation between these two states (~30%), another attractive feature is that the material state is maintained in the absence of any additional electrical stimulus. For this reason, GST is nearing commercialization as next-generation non-volatile electronic memory and has also been demonstrated as a constituent of all-optical memory. In some approaches, a chalcogenide glass material may be suitable for applications where it is desired to only occasionally reconfigure the metasurface and yet provide good thermal stability and environmental stability. For example, in free-space optical links, gradual drift of the transmitter or receiver may be compensated by low duty-cycle changes to the beam-pointing direction. At the same time, the large index modulation in these materials allows for the use of lower-Q resonators, simplifying design and easing fabrication tolerances.

The various metasurface architectures described herein may be fabricated using standard CMOS-compatible materials and processes. In embodiments that include a metal reflector under the dielectric pillars, the metal reflector may be made from aluminum, a CMOS-compatible metal, without sacrificing performance. In contrast, a plasmonic system may rely on the noble metals gold and silver, which are more difficult to integrate into CMOS manufacturing processes.

The dielectric members shaped like pillar or elongated wall structures can be made of amorphous or poly-crystalline silicon via plasma-enhanced chemical vapor deposition (PECVD) followed by deep reactive ion etching. Fabrication may proceed with either electron-beam lithography for smaller production volumes (e.g., for prototyping), or with photolithography for larger production volumes (e.g. for commercial manufacture). In the embodiments described herein, the minimum feature size is about 100 nanometers, well within the limits of deep UV lithography. For example, 40-nanometer node technology is now a commodity process offered by many CMOS foundries, while custom foundry services offered by Intel operate at the 14-nanometer node. Furthermore, several foundries have recently been established that focus specifically on photonic-electronic integration, such as AIM Photonics.

As previously described, the feature sizes of the dielectric resonator elements may be varied for an operational bandwidth that includes a portion of the visible light spectrum, the infrared spectrum, the near-infrared spectrum, the shortwavelength infrared spectrum, the medium-wavelength infrared spectrum, the long-wavelength infrared spectrum, the far infrared spectrum, and various telecommunications wavelengths like microwaves and beyond. In some embodiments, an array of dielectric resonator elements may include a first set of elements for a first frequency band and a second set of elements for a second frequency band. One set or the other may be utilized depending on which frequency band is operational at a given time. In other embodiments, both sets of elements may be used simultaneously. Multiple sets of elements may be used for multiple frequency bands.

A transmitter may transmit optical radiation to the reflective surface. The reflective surface may reflect the transmitted optical radiation according to a reflection pattern (e.g., beamformed) based on a voltage differential pattern applied to the array of dielectric resonator elements. Similarly, incident beamformed optical radiation may be received by the array of dielectric resonator elements based on the applied voltage differential pattern. The received beamformed optical radiation may be reflected to a receiver. In some embodiments, a first array of dielectric resonator elements may be used for transmitting and a second array of dielectric resonator elements may be used for receiving. In other embodiments, a single array may be shared for both receiving and transmitting.

It is appreciated that a wide variety of materials may be used to form the dielectric members that are paired to form a dielectric resonant member. Examples of suitable materials for various operational bandwidths include, but are not limited to, silicon (Si), germanium (Ge), gallium arsenide (GaAs), amorphous silicon (a-Si), the like, and combinations thereof. As previously noted, the adjustable refractive index material may comprise liquid crystal material, an electro-optical polymer material, silicon, one or more chalcogenide glasses, the like, and combinations thereof.

The control functionality of the dielectric resonator elements may be similar to the control of other metamaterial devices and metasurfaces. By controlling the phase (e.g., reflection phase) of individual subwavelength elements, beamforming can be accomplished. Controlling the individual elements may be accomplished by calculation, optimization, lookup tables, and/or trial and error. The disclosures referenced above and incorporated herein by reference provide some suitable examples for controlling individual elements. Other approaches known in the art may be utilized as well. In fact, many existing computing devices and infrastructures may be used in combination with the presently described systems and methods.

Some of the infrastructure that can be used with embodiments disclosed herein is already available, such as general-purpose computers, computer programming tools and techniques, digital storage media, and communication links. Many of the systems, subsystems, modules, components, and the like that are described herein may be implemented as hardware, firmware, and/or software. Various systems, subsystems, modules, and components are described in terms of the function(s) they perform because such a wide variety of possible implementations exist. For example, it is appreciated that many existing programming languages, hardware devices, frequency bands, circuits, software platforms, networking infrastructures, and/or data stores may be utilized alone or in combination to implement a specific control function.

It is also appreciated that two or more of the elements, devices, systems, subsystems, components, modules, etc. that are described herein may be combined as a single element, device, system, subsystem, module, or component. Moreover, many of the elements, devices, systems, subsystems, components, and modules may be duplicated or further divided into discrete elements, devices, systems, subsystems, components or modules to perform subtasks of those described herein. Any of the embodiments described herein may be combined with any combination of other embodiments described herein. The various permutations and combinations of embodiments are contemplated to the extent that they do not contradict one another.

As used herein, a computing device, system, subsystem, module, or controller may include a processor, such as a microprocessor, a microcontroller, logic circuitry, or the like. A processor may include one or more special-purpose processing devices, such as application-specific integrated circuits (ASICs), programmable array logic (PAL), programmable logic array (PLA), programmable logic device (PLD), field-programmable gate array (FPGA), or other customizable and/or programmable device. The computing device may also include a machine-readable storage device, such as non-volatile memory, static RAM, dynamic RAM, ROM, CD-ROM, disk, tape, magnetic, optical, flash memory, or another machine-readable storage medium. Various aspects of certain embodiments may be implemented using hardware, software, firmware, or a combination thereof.

The components of some of the disclosed embodiments are described and illustrated in the figures herein. Many portions thereof could be arranged and designed in a wide variety of different configurations. Furthermore, the features, structures, and operations associated with one embodiment may be applied to or combined with the features, structures, or operations described in conjunction with another embodiment. In many instances, well-known structures, materials, or operations are not shown or described in detail to avoid obscuring aspects of this disclosure. The right to add any described embodiment or feature to any one of the figures and/or as a new figure is explicitly reserved.

The embodiments of the systems and methods provided within this disclosure are not intended to limit the scope of the disclosure but are merely representative of possible embodiments. In addition, the steps of a method do not necessarily need to be executed in any specific order, or even sequentially, nor do the steps need to be executed only once. As previously noted, descriptions and variations described in terms of transmitters are equally applicable to receivers, and vice versa.

FIG. 1A illustrates a simplified embodiment of an optical surface scattering antenna device 100 with pairs 150-161 of elongated dielectric members with adjustable refractive index material therebetween forming dielectric resonator elements. As illustrated, the pairs 150-161 of elongated dielectric members extend from an underlying substrate 190 and are elongated from one end or edge of the substrate 190 to the other. In alternative embodiments, the substrate 190 may extend further than the elongated dielectric members.

Figure 1B:
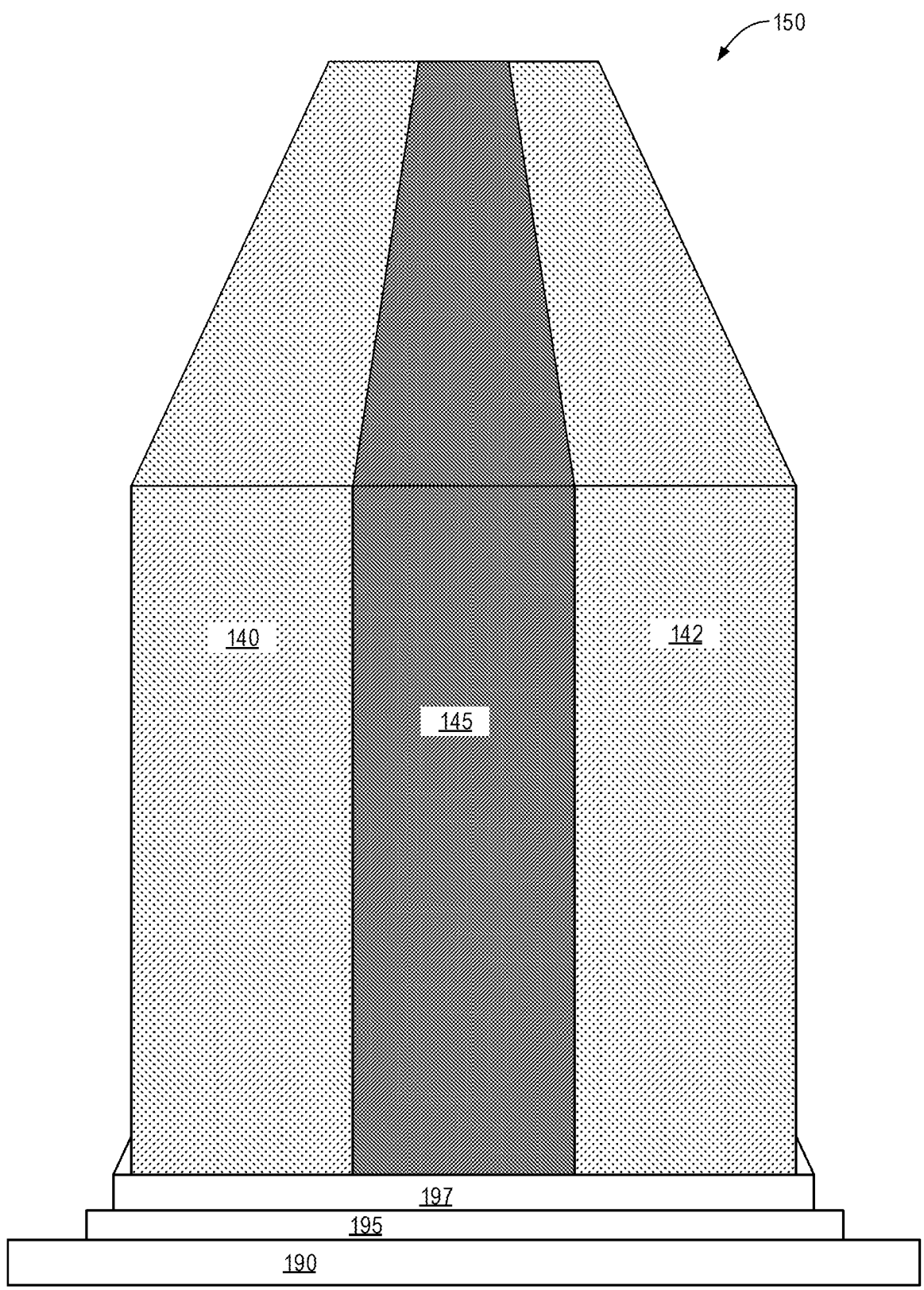
FIG. 1B illustrates an example of single dielectric resonator element extending from a substrate with an underlying reflective layer.

FIG. 1B illustrates an example of single, subwavelength dielectric resonator element 150 extending from a substrate 190 with an underlying reflective layer 195 and an electrically insulating layer 197. As illustrated, the dielectric resonator element 150 comprises a first elongated dielectric member 140 that extends up from the substrate 190, has a defined width, and a defined length. As can be more clearly seen in FIG. 1A, the elongated dielectric member 140 may extend between edges of the substrate and/or at least be several times longer than it is wide.

A second opposing dielectric member 142 is substantially parallel to the first dielectric member 140. An adjustable (e.g., tunable) refractive index material 145 is disposed within a gap between the first 140 and second 142 dielectric members. In some embodiments, the adjustable refractive index material 145 may be disposed all around the first 140 and second 142 dielectric members, but it is at least disposed within the gap between the first 140 and second 142 dielectric members. The width and height of the first 140 and second 142 dielectric members may be selected to attain a specific resonant frequency tuning. Furthermore, the spacing between the first 140 and second 142 dielectric members and the height of each of the first 140 and second 142 dielectric members may be selected to correspond to a fundamental harmonic mode, a second order harmonic mode, etc. The dimensions can be selected to attain a target number of antinodes between the first 140 and second 142 dielectric members across the gap and along the height of the gap. Similar dimension selections may be made with respect to the length of the first 140 and second 142 dielectric members.

As previously described, the dielectric members 140 and 142 may be manufactured using silicon (Si), germanium (Ge), gallium arsenide (GaAs), amorphous silicon (a-Si), the like, and combinations thereof. The substrate 190 may be the same material or a different material. In some embodiments, the various dielectric members, including the first 140 and second 142 dielectric members may be manufactured using chemical etching, bonding, micro-lithographic processes, nano-lithographic processes, CMOS lithography, PECVD, reactive ion etching, electron beam etching, and/or the like.

The adjustable refractive index material 145 may comprise liquid crystal. In other embodiments, the adjustable refractive index material 145 may comprise one or more of an electro-optic polymer, liquid crystals, a chalcogenide glass, and/or silicon. Each of these materials may have a static or quasi-static index of refraction for an operational bandwidth (i.e., an optical operational bandwidth). However, by applying a voltage to one or both of the first 140 and second 142 dielectric members, a voltage differential between the two dielectric members 140 and 142 can subject the adjustable refractive index material 145 to an electric field.

A material for the adjustable refractive index material 145 may be selected based on a desired tuning mechanism, refractive index modulation (shown as a percentage below), and typical frequency response. Example values of four general categories of material are shown below in Table 1. It is, however, appreciated that different values may be attained based on the specific species or properties of a given material.

| Material | Tuning Mechanism | Typical $\Delta n/n$ | Typical Frequency |
|---|---|---|---|
| Electro-Optic Polymers | Pockels Effect | ≈2-4% | >10 GHz |
| Liquid Crystals | Tunable Birefringence | ≈13% | ≈100 Hz |
| Chalcogenide Glasses | Phase Change | ≈30% | ≈100 MHz |
| Silicon | Thermo-Optic Effect | ≈0.3% | ≈kHz-MHz |

Many materials considerations and tradeoffs may be considered in the selection of the proper tunable material. One significant material parameter is the relative refractive index modulation ($\Delta n/n$), which ultimately determines the achievable local phase shift of the element. Materials with larger index modulations allow for larger phase shifts for a given resonance Q factor. To achieve full phase modulation, the resonance Q factor of the element should be $Q > n/\Delta n$. Therefore, plasmonic structures, which have modest resonator Q values limited by losses in metals (Q<10) require materials with the largest index modulation. On the other hand, dielectric nanostructures can have much larger resonance Q values, as we will show below, opening up the use of material sets with modest index modulation but fast switching speeds. In general, there is a tradeoff between index modulation and response speed of the material. Materials with the largest index modulation of ~30%—such as liquid crystals—typically have response rates on the order of ~100 Hz, while electro-optic polymers, based on the Pockels effect, typically have index modulation of 6% or less, but with GHz response rates. At the same time, the material should have low optical absorption at the operating wavelength if phase holograms with high efficiency are desired.

In various embodiments, the "surface" may be described as including the substrate 190, a reflective layer or patch 195, and/or an electrically insulating layer 197. In some embodiments, the reflective layer or patch 195 may not be electrically conductive and so no insulating layer 197 may be necessary. In other embodiments, the substrate 190 and the reflective layer 195 may be the same layer (i.e., the substrate may be optically reflective).

Figure 1C:
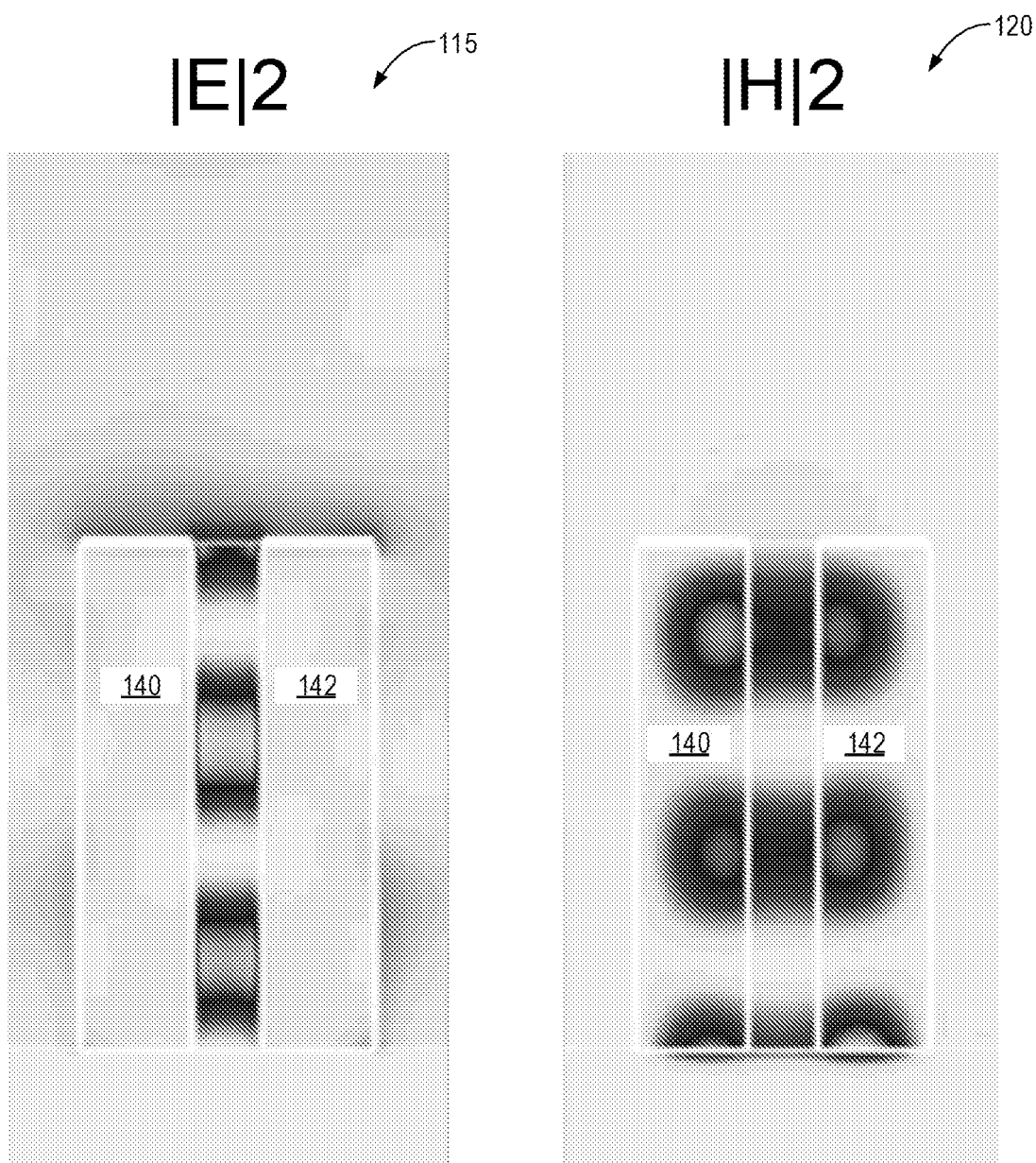
FIG. 1C illustrates simulated electric and magnetic energy densities within the dielectric resonator element of FIG. 1B with excitation at 80° relative to normal with transverse magnetic (TM) polarization.

FIG. 1C illustrates simulated electric 115 and magnetic 120 energy densities within the dielectric resonator element of FIG. 1B with excitation at a grazing incidence angle of approximately 70-80° relative to normal with transverse magnetic (TM) polarization. A telecommunications wavelength of approximately 1,550 nanometers is used for the simulation.

The grazing incidence of the incident wave excites magnetic-like Mie resonances in the dielectric members (e.g., elongated silicon walls) with a high Q factor, enabling dynamic modulation of the phase. Additionally, the dielectric members are situated over a reflective metallic ground plane, making the structure operate as a reflect-array. Because the dielectric members themselves may have only weak mechanisms for refractive index tuning, the illustrative resonator geometry consists of two dielectric members with a core material disposed therebetween that has a tunable or adjustable refractive index.

As illustrated, under the grazing incidence excitation, the electric field 115 is strongly localized in adjustable refractive index material between the first 140 and second 142 dielectric members, while the magnetic field 120 is strongly localized to the dielectric members 140 and 142 themselves.

Figure 1D:
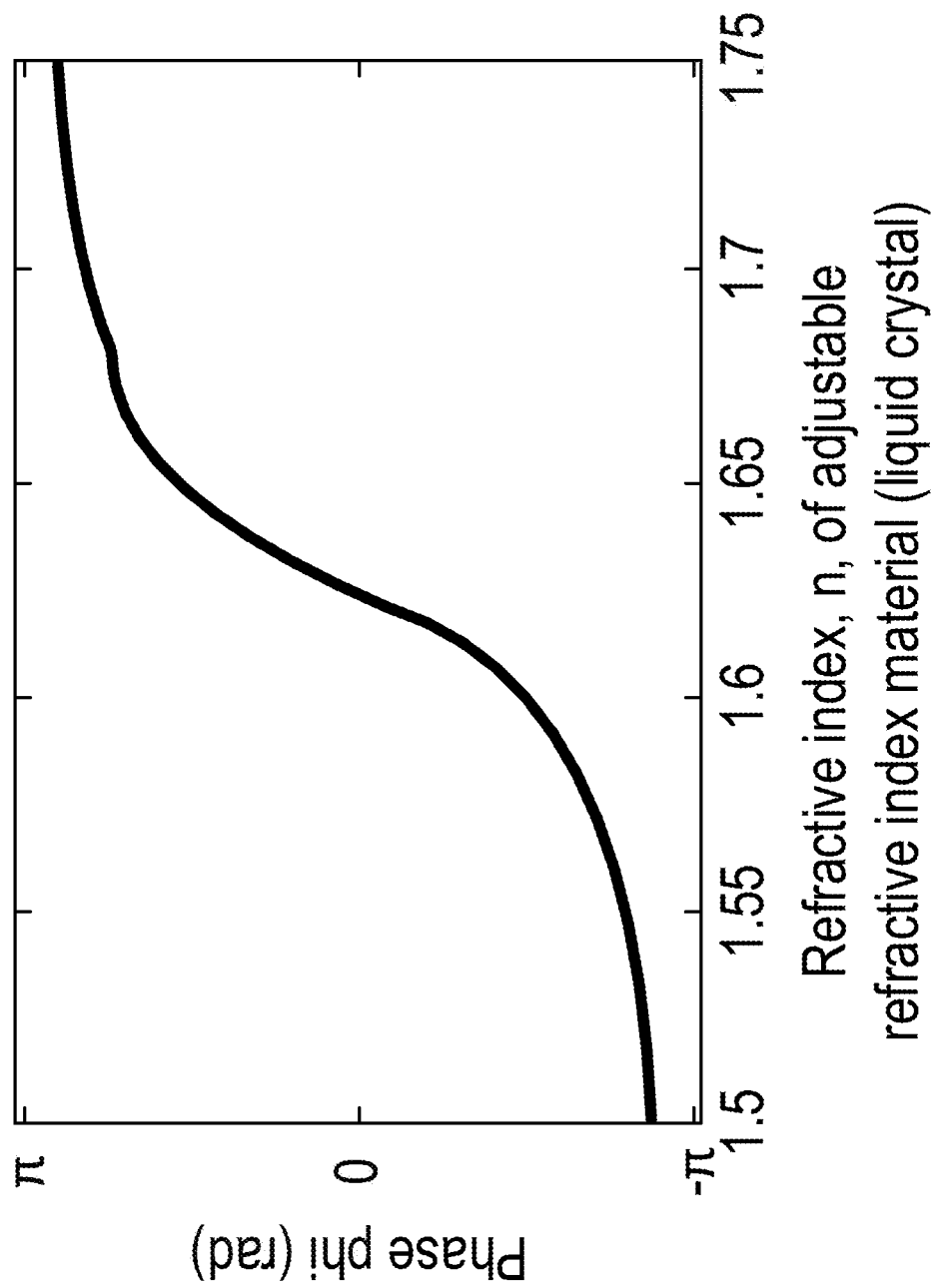
FIG. 1D illustrates the reflection phase of the single dielectric resonator element of FIG. 1B as a function of the refractive index of the adjustable refractive index material.

FIG. 1D illustrates the reflection phase of the single dielectric resonator element of FIG. 1B as a function of refractive index of the adjustable refractive index material. As illustrated, the reflection phase of the dielectric resonator element can be varied significantly based on the refractive index of the adjustable refractive index material. As illustrated, a phase modulation of nearly a is possible with a refractive index modulation of just 7%.

Figure 1E:
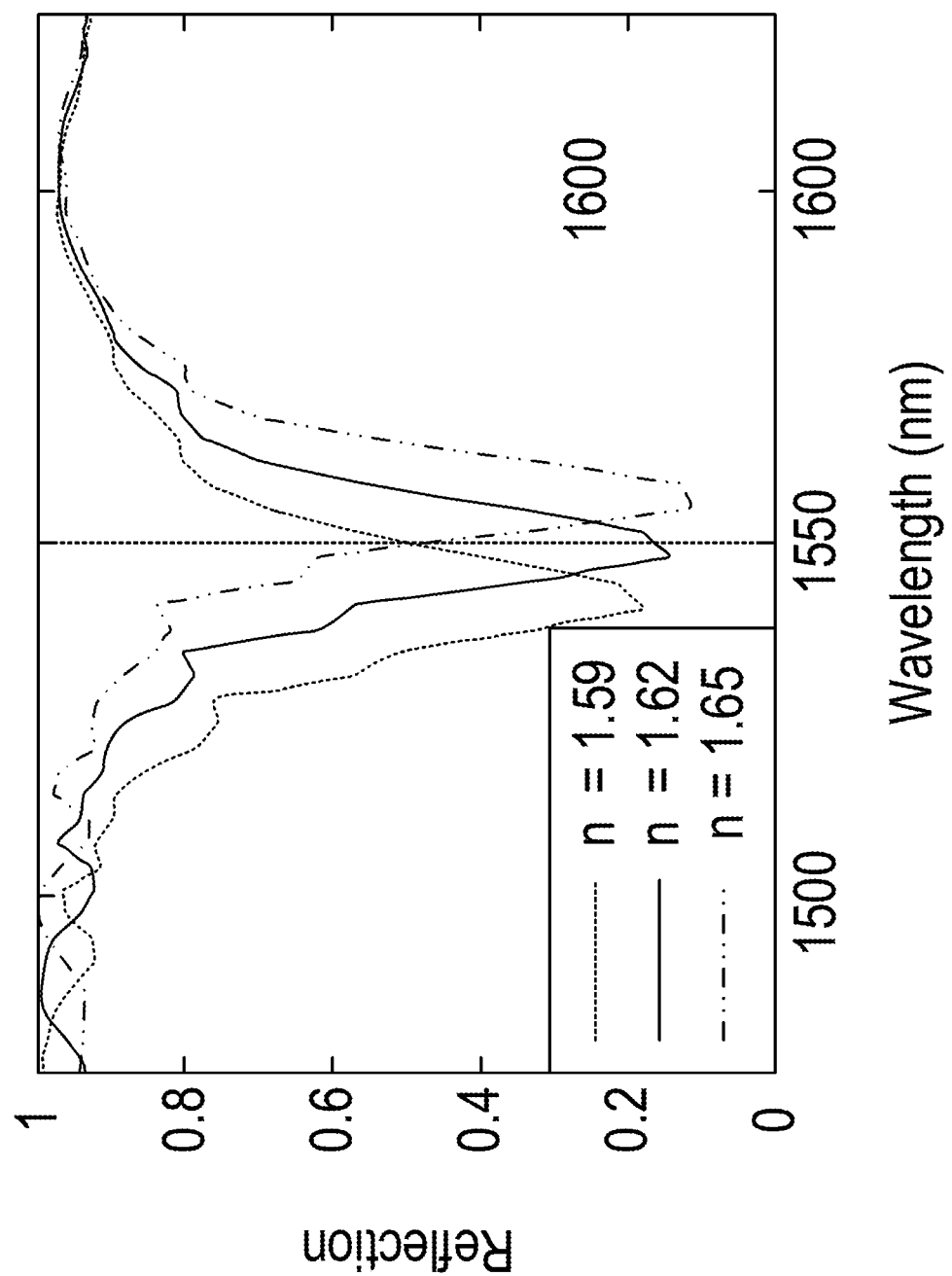
FIG. 1E illustrates the reflection spectrum of the high-Q dielectric resonator element of FIG. 1B.

FIG. 1E illustrates the reflection spectrum of the high-Q dielectric resonator element of FIG. 1B. This high sensitivity to the refractive index of the core is enabled by the high-Q of the resonance (Q=64) in the illustrated example. The devices described herein exhibit a high sensitivity of the reflection phase to the refractive index of the adjustable refractive index material disposed in the gap between the first and second dielectric members. This high sensitivity and the ability to tune or adjust the refractive index material enables the creation of dynamic metasurfaces.

In an illustrative embodiment, the high-Q dielectric resonances are utilized to define a one-dimensional beamforming hologram. The use of a one-dimensional hologram is for convenient illustration only, and other embodiments provide a two-dimensional hologram. In one approach, the hologram phase may be calculated, for example, by using a Gerchberg-Saxton algorithm, while imposing a phase-amplitude constraint in the plane of the hologram due to the Lorentzian resonant nature of the metasurface elements. The calculated phase at each dielectric resonant element is highly correlated with the refractive index of the adjustable refractive index of each dielectric resonant element.

By adjusting the refractive index, a pattern of refractive indices can be attained that corresponds to a specific holograph phase. The refractive index of each dielectric resonant element may be mapped to a specific applied voltage differential. Accordingly, each pattern of applied voltage differentials corresponds to a unique pattern of refractive indices and a corresponding phase holograph.

Figure 2:
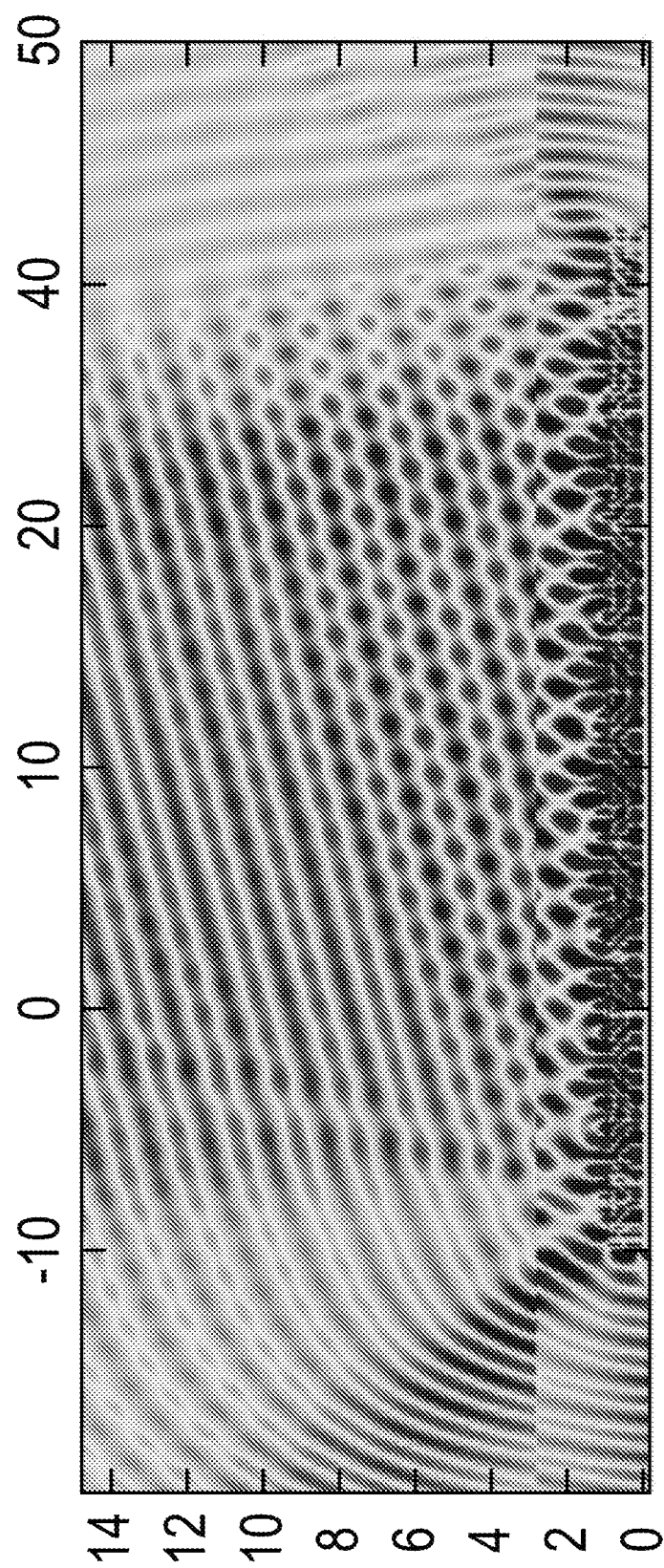
FIG. 2 illustrates an example representation of the beam-steering capabilities of an optical surface scattering antenna similar to the antenna illustrated in FIG. 1A.

FIG. 2 illustrates an example representation of the beam-steering capabilities of an optical surface scattering antenna similar to the antenna illustrated in FIG. 1A. Specifically, FIG. 2 shows the electric field profile of the incident wave (grazing angle) and the reflected outgoing wave. As illustrated, a single beam is formed in the target direction of θ=−10°. The far-field intensity profile shows that a single beam is formed in that direction with minimal side lobes. The efficiency of the transmission may be approximately 35%, defined as the fraction of incident light directed into the target beamform, including losses due to absorption.

The far-field patterns from other target directions are also shown, demonstrating that a dynamic holograph is possible. The appearance of significant side lobes is likely due to artifacts of aliasing, discretization, and/or inter-element coupling. These artifacts can be mitigated by employing one or more of the artifact-reduction approaches described in the references incorporated by reference above.

Figure 3:
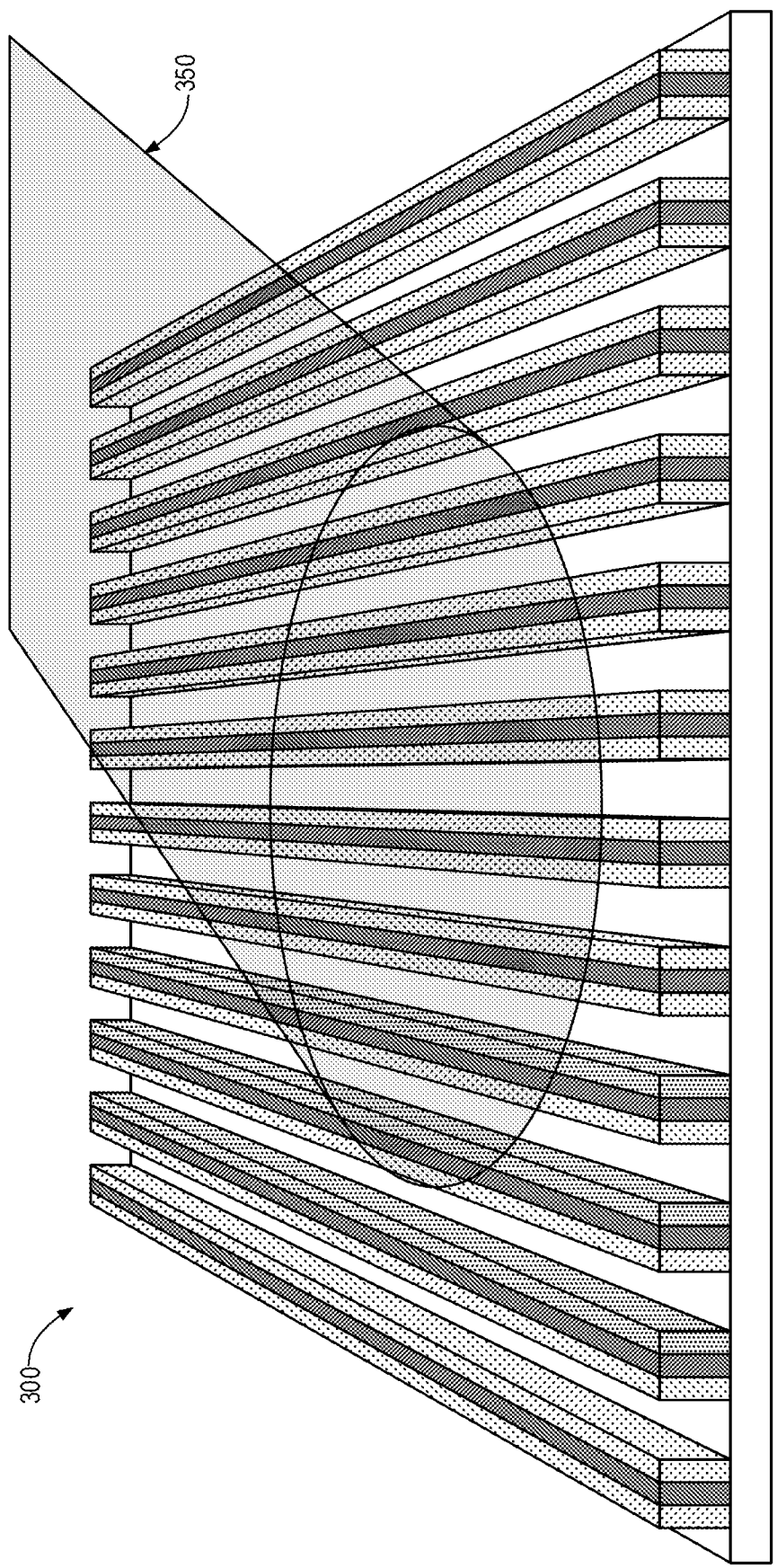
FIG. 3 illustrates a simplified diagram of steerable beam of reflected optical radiation possible via an optical surface scattering antenna similar to the antenna illustrated in FIG. 1A.

FIG. 3 illustrates a simplified diagram of steerable beam 350 of reflected optical radiation possible via an optical surface scattering antenna 300 similar to the antenna illustrated in FIG. 1A.

Figure 4A:
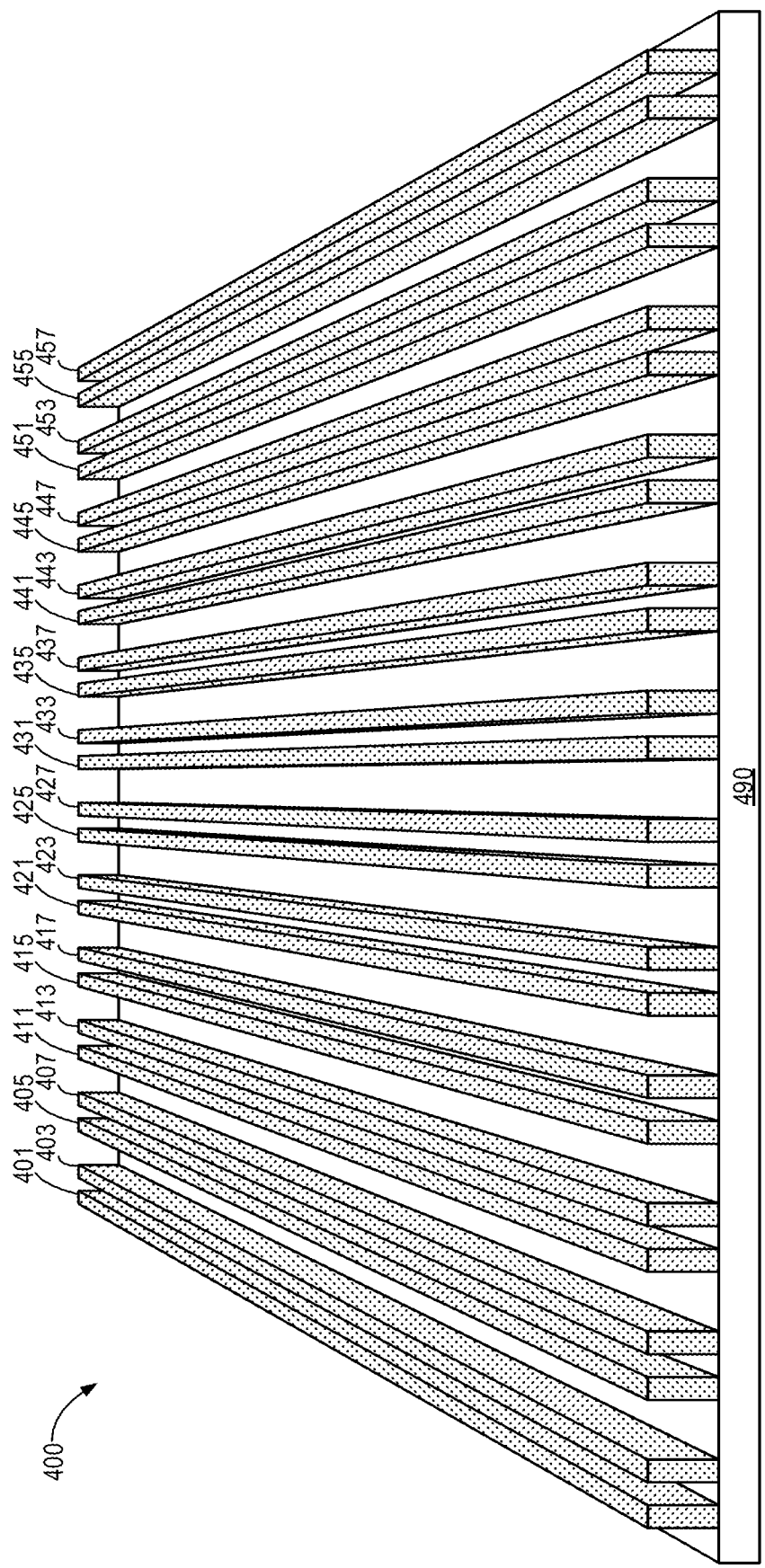
FIG. 4A illustrates a simplified embodiment of an array of paired dielectric members extending from a surface.

FIG. 4A illustrates a simplified embodiment of an array 400 of twelve paired dielectric members 401/403, 405/407, 411/413, 415/417, 421/423, 425/427, 431/433, 435/437, 441/443, 445/447, 451/453, and 455/457 (collectively 401-457) extending from a surface 490. The simplified array 400 shows only twelve paired dielectric members. Functional embodiments may include thousands, tens of thousands, hundreds of thousands, or even millions of paired dielectric members. For example, an antenna that is 3 centimeters wide may include tens of thousands of paired dielectric members. (e.g., approximately 45,000 for 700-nanometer devices). Larger antennas may include a proportionally larger number of dielectric members depending on the feature sizes for a given operational bandwidth.

Figure 4B:
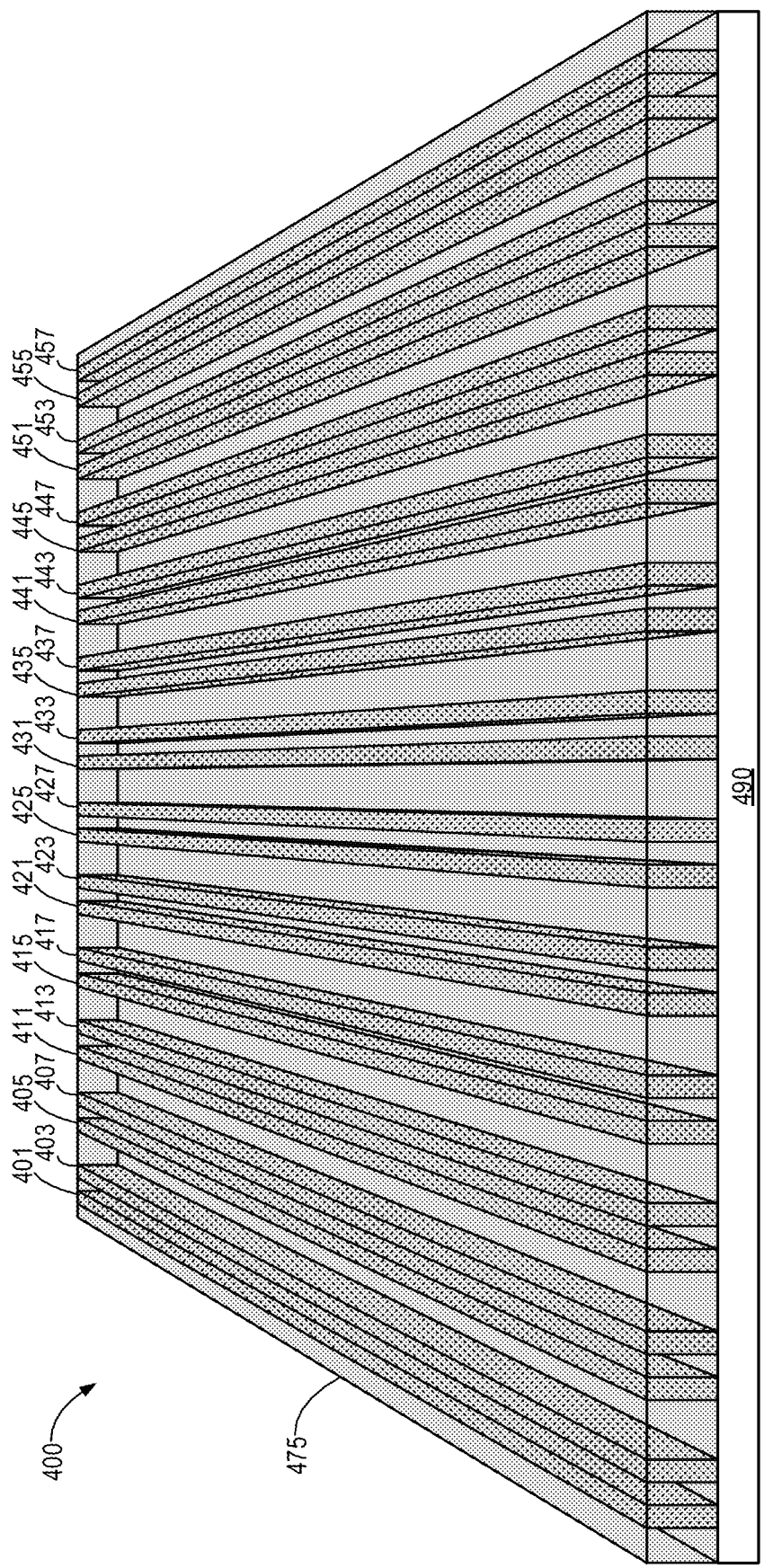
FIG. 4B illustrates a simplified embodiment of an adjustable refractive index material added to the array of paired dielectric members extending from the surface.

FIG. 4B illustrates the simplified embodiment of FIG. 4A with an adjustable refractive index material 475 added to the array 400 of paired dielectric members 401-457 extending from the surface 490. As previously noted, the surface 490 may be a silicon or germanium substrate, may be or include a reflective layer (e.g., copper or silver), and/or may include an electrically-insulating material to insulate at least one dielectric member of each pair of dielectric members 401-457. In some embodiments, one dielectric member of each pair of dielectric members 401-457 may be electrically connected to the reflective layer that serves as an electrical ground. The other insulated dielectric member of each pair of dielectric members 401-457 may be connected to an electric lead.

A controller may selectively provide voltage values to each of the insulated dielectric members to induce an electric field within the adjustable refractive index material 475 in the region (gap) between each pair of dielectric members 401-457. By varying the applied voltage pattern to the various pairs of dielectric members 401-457, a target reflection pattern for incident optical radiation may be attained. Each pair of dielectric members 401-457 and the adjustable refractive index material 475 therebetween functions as a subwavelength dielectric resonator element whose refractive index can be varied with time based on a control voltage input. Accordingly, the simplified array 400 includes twelve elongated subwavelength dielectric resonator elements.

Figure 5A:
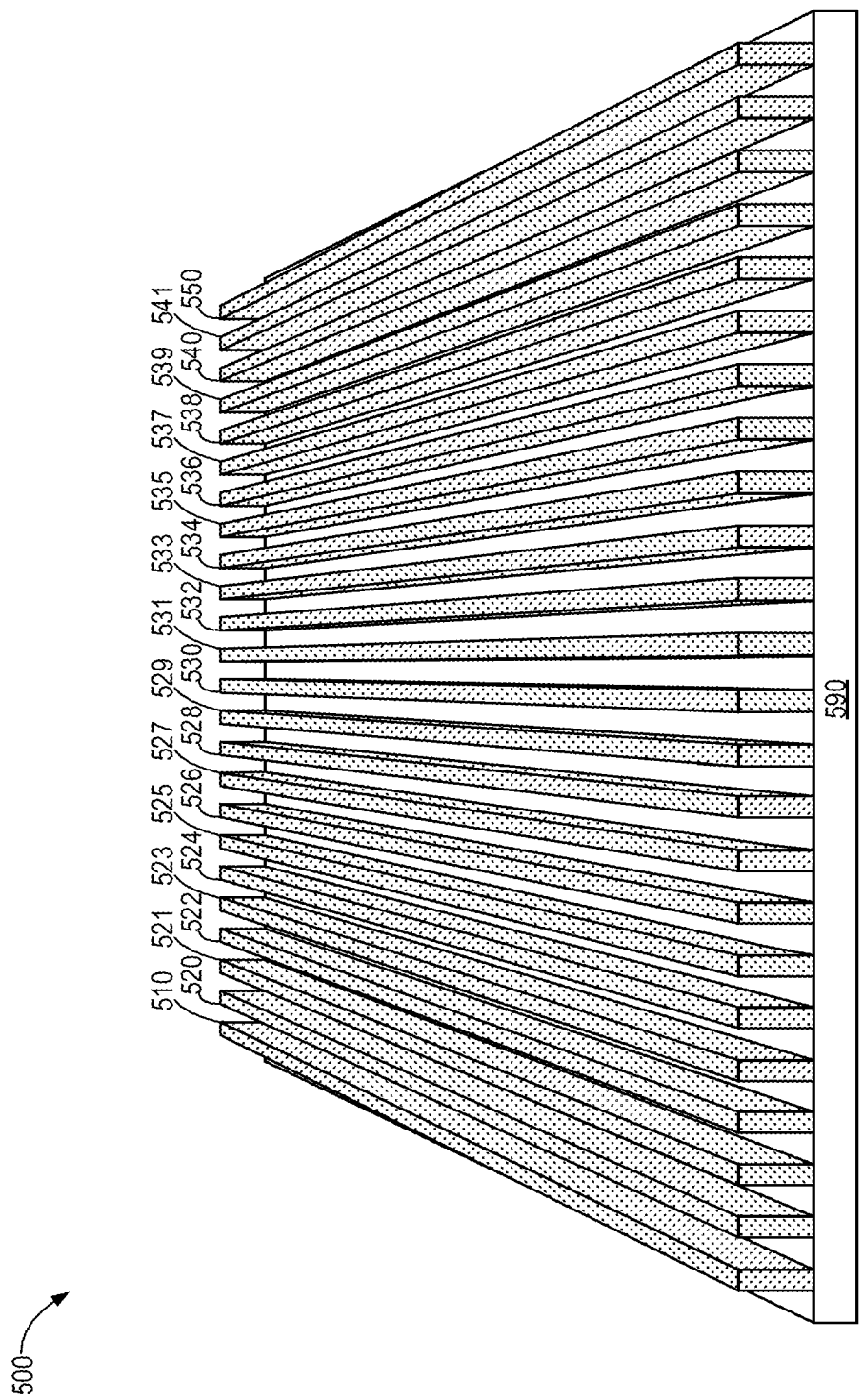
FIG. 5A illustrates a simplified embodiment of an array of unpaired dielectric members extending from a surface.

FIG. 5A illustrates a simplified embodiment of an array 500 of twenty-four unpaired dielectric members 510, 520-541, and 550 extending from a surface 590. The unpaired dielectric members 510, 520-541, and 550 can be used to form twenty-three subwavelength dielectric resonator elements, once an adjustable refractive index material is positioned between each of the unpaired dielectric members 510, 520-541, and 550. In such an embodiment, each of the dielectric members 520-541 is shared by two dielectric resonator elements, while the two end dielectric members 510 and 550 are not shared.

Figure 5B:
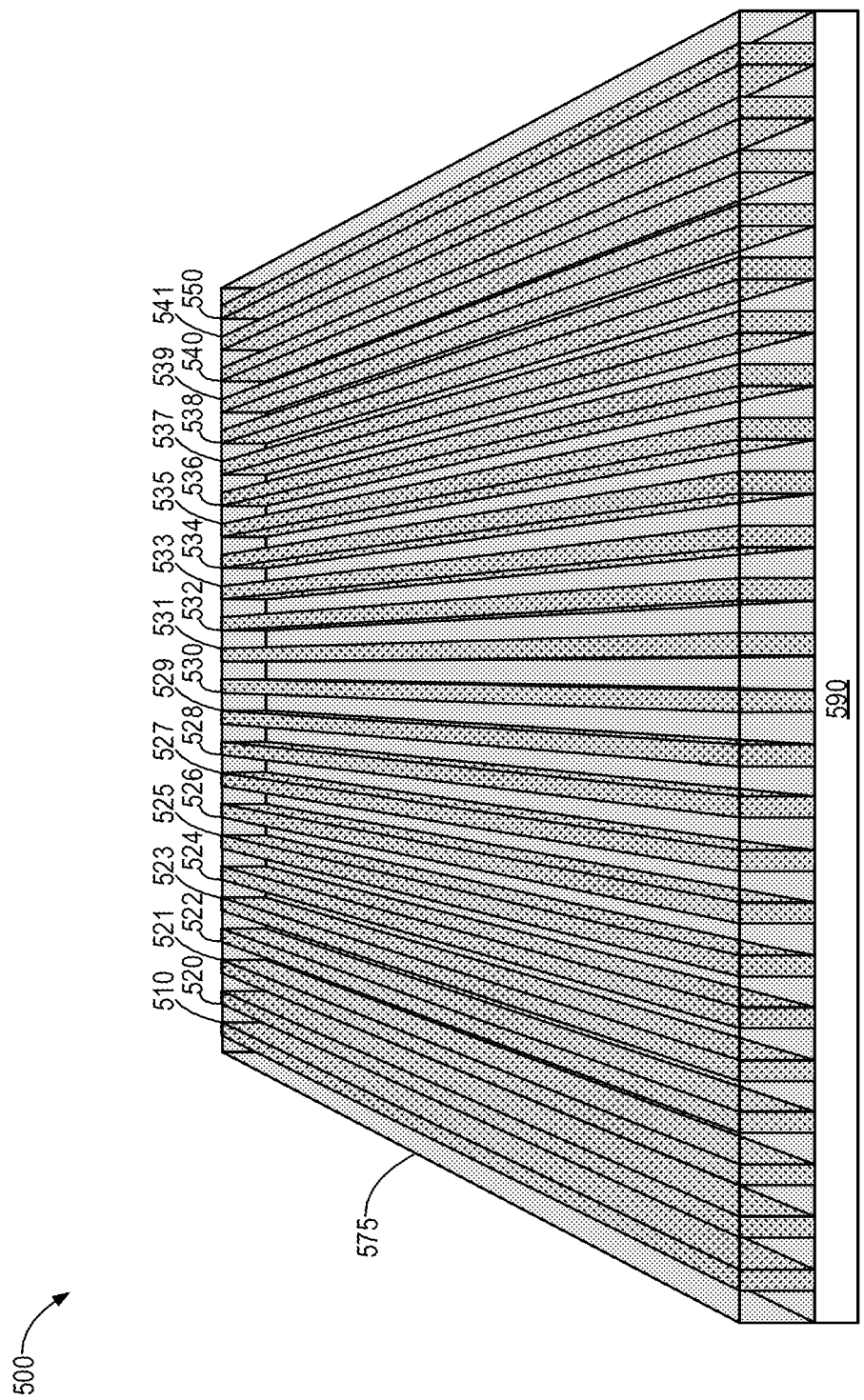
FIG. 5B illustrates a simplified embodiment of an adjustable refractive index material added to the array of unpaired dielectric members extending from the surface.

FIG. 5B illustrates the simplified embodiment of the array 500 with an adjustable refractive index material 575 added between each of the unpaired dielectric members 510, 520-541, and 550 to form twenty-three tunable dielectric resonator elements. Each of the dielectric members 510, 520-541, and 550 may be connected to an electrical lead to provide a specific voltage value and thereby induce a desired electric field within the adjustable refractive index material 575 between adjacent dielectric members 510, 520-541, and 550. In some embodiments, an entire antenna array may comprise unpaired dielectric members that are uniformly spaced such that the voltage values applied from one end to the other are continuously increasing. In other embodiments, sets of a specific number of unpaired dielectric members with adjustable refractive index material disposed therebetween may be replicated multiple times to form an antenna array.

For example, assuming a voltage differential of between 0.0 and 0.5 volts is desired between each adjacent set of dielectric members, then for the illustrated embodiment that includes twenty-four dielectric members, the voltage would need to range from −6 volts at one end (e.g., dielectric member 510) to +5.5 volts at the other end (dielectric member 550). In some embodiments, a 0.5 voltage differential may not provide a sufficient range of adjustability of the refractive index of the adjustable refractive index material 575 and so a larger voltage range may be used.

However, voltages that exceed a certain limit may arc between dielectric members. Accordingly, a fewer number of dielectric members may be shared and these small sets of shared dielectric members may be replicated many times. For example, up to a 6-volt differential may be attained between adjacent dielectric members in a set of five shared dielectric members using total voltage range between −12 volts and +12 volts. The set of five shared dielectric members, controllable between 12-volt rails, may be replicated many thousands of times on a surface to provide an array of subwavelength dielectric resonator elements that each share at least one dielectric member with an adjacent subwavelength dielectric resonator element.

Figure 6:
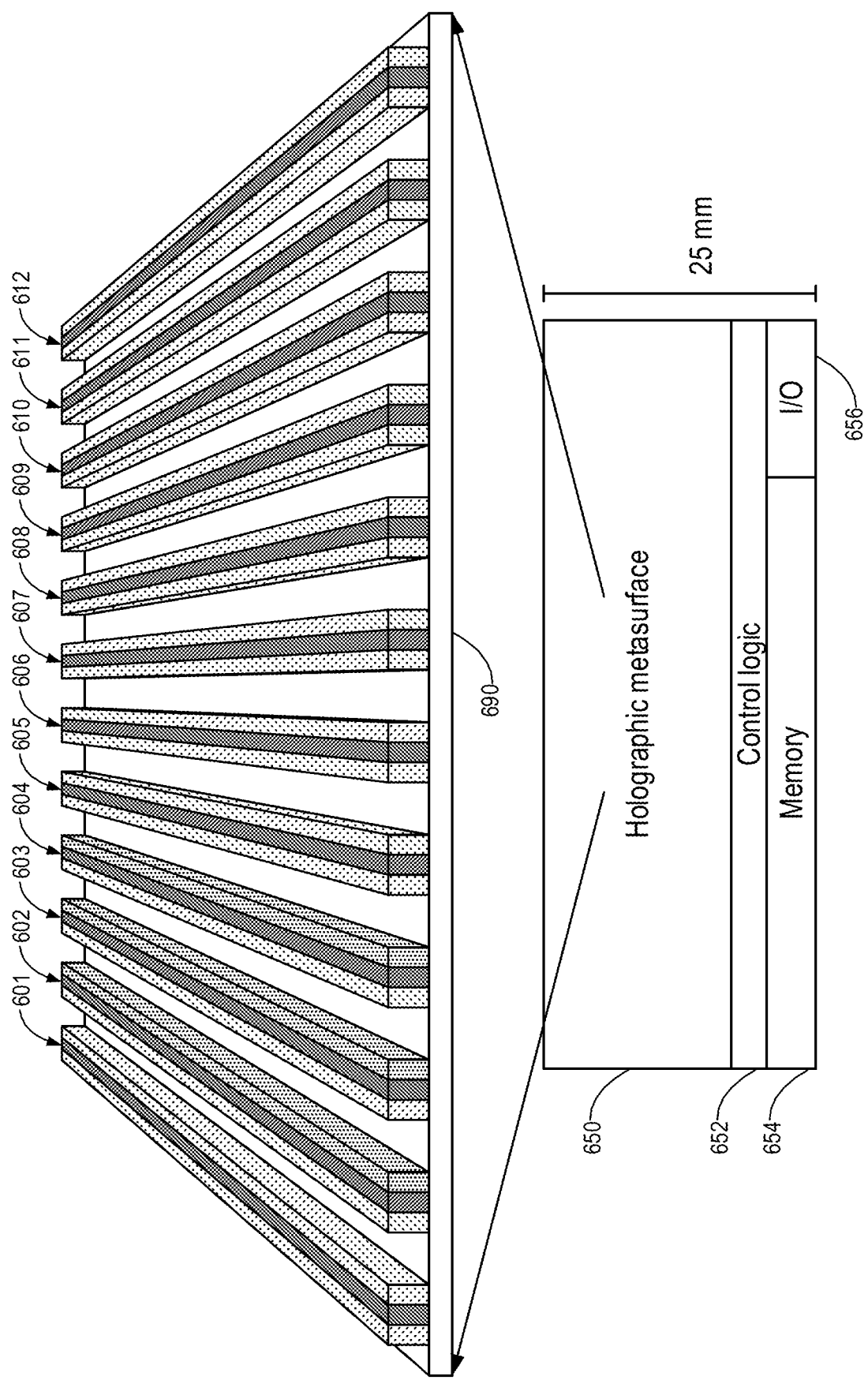
FIG. 6 illustrates a holographic metasurface, control logic, memory, and an input/output port to form a transmit and/or receive optical surface scattering antenna system.

FIG. 6 illustrates a holographic metasurface 650 with a dozen subwavelength dielectric resonator elements 601-612. In the illustrated embodiment, each dielectric resonator element 601-612 includes two paired dielectric members that extend from a substrate 690 and are elongated between opposing edges of the substrate 690. Control logic 652, memory 654, and an input/output port 656 may be paired with the holographic metasurface 650 to form a transmit and/or receive optical surface scattering antenna system.

The control logic may provide voltage signals to each dielectric member to create an electric field within the adjustable refractive index material of each of the dielectric resonator elements 601-612. In some embodiments, one of the dielectric members of each of the dielectric resonator elements 601-612 may be connected to ground. Regardless, a pattern of voltage differentials may be generated by the control logic to attain a specific pattern of refractive indices that corresponds to a target reflection pattern of the optical surface scattering antenna system.

Figure 7:
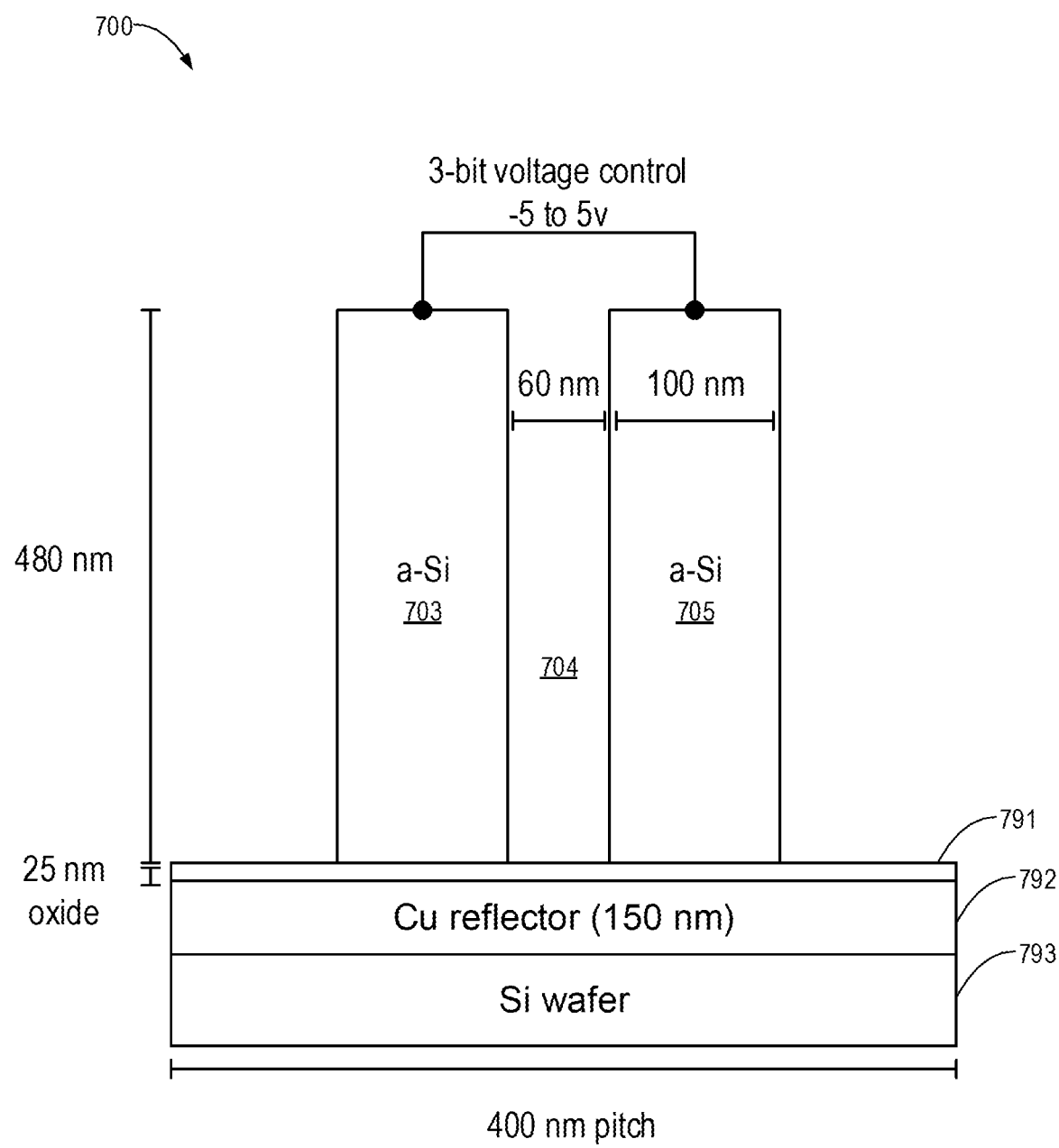
FIG. 7 illustrates an example of a dielectric resonator element extending from a substrate, including an optically reflective layer and an electrically insulating layer.

FIG. 7 illustrates a very specific example of a dielectric resonator element 700 configured to operate in a narrow bandwidth that includes infrared light at 905 nanometers. In the specific embodiment, paired dielectric members (first dielectric member 703 and second dielectric member 705) are formed from amorphous silicon (a-Si) and extend from the surface by approximately 480 nanometers. The surface includes a 25-nanometer oxide insulating layer 791, a 150-nanometer copper reflector 792, and a silicon wafer substrate 793.

A gap 704 between the first 703 and second 705 dielectric members may be approximately 60 nanometers wide and be filled with a liquid crystal or voltage-tunable polymer. A 3-bit voltage controller may apply a voltage differential between 0 and 10 volts (−5 volts to +5 volts) to select a desired effective refractive index of the dielectric resonator element 700 that is highly correlated with the voltage-tunable liquid crystal or polymer. A desired Q factor of the dielectric resonator element 700 is selected based on the height of the dielectric members 703 and 705 (shown as 480 nanometers) and the widths of each of the dielectric members (shown as 100 nanometers).

A plurality (i.e., thousands) of dielectric resonator elements like the dielectric resonator element 700 in FIG. 7 may be arranged in an array with a device pitch of approximately 400 nanometers. The dielectric resonator elements may be elongated and arranged in a one-dimensional array, similar to the embodiment shown in FIG. 1A, or they may have a shorter length and be arranged in a two-dimensional array as show and described in subsequent figures below.

Figure 8:
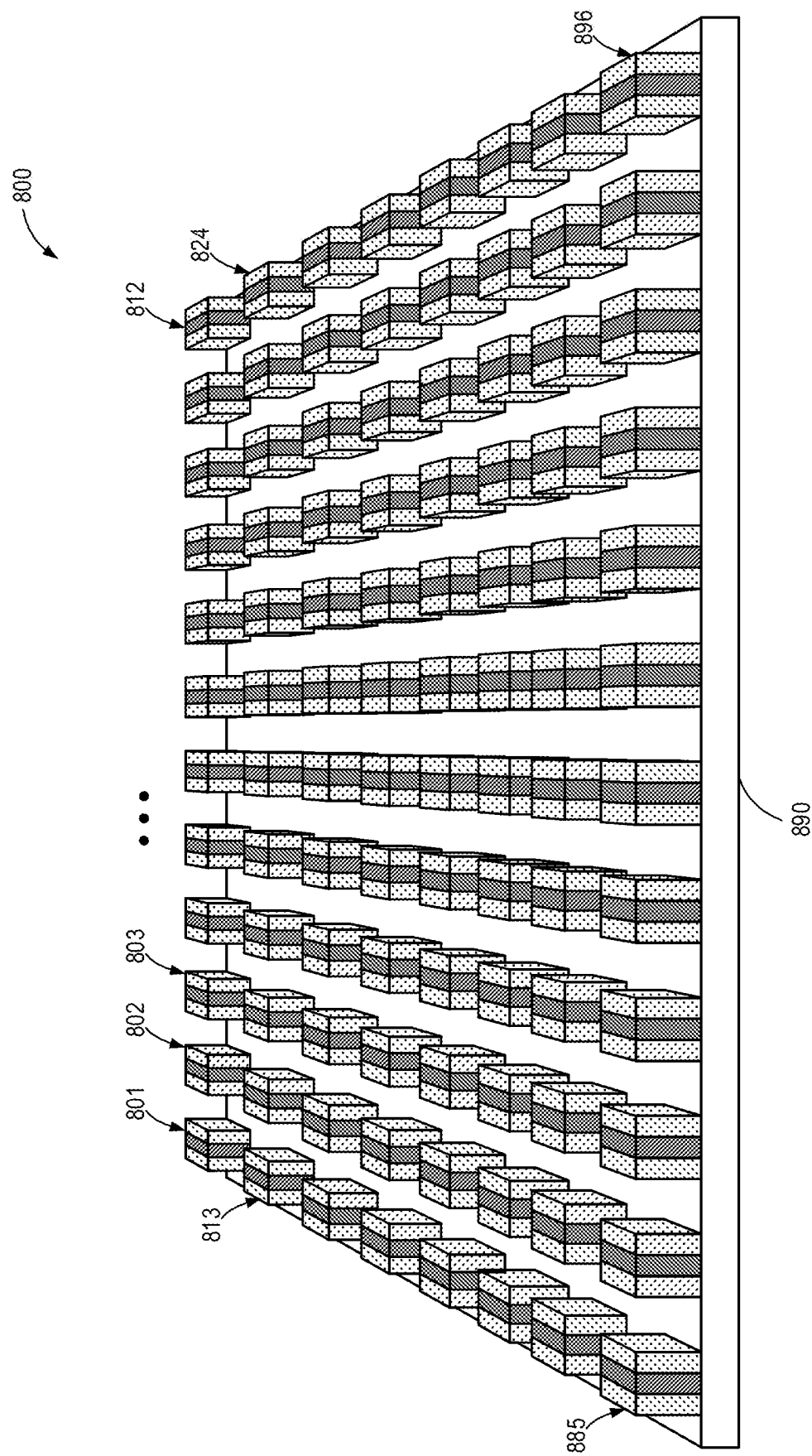
FIG. 8 illustrates a simplified embodiment of an optical surface scattering device with pairs of pillar dielectric members with adjustable refractive index material therebetween forming dielectric resonator elements.

FIG. 8 illustrates a simplified embodiment of an optical surface scattering device 800 with one hundred and ninety-two pillar-shaped dielectric members (lighter shading) arranged in ninety-six pillar pairs with adjustable refractive index material (darker shading) therebetween to form ninety-six dielectric resonator elements 801-896 (only some of which are labeled to avoid obscuring the drawing). Each of the pillar-shaped dielectric resonator elements 801-896 is configured with a target Q factor. The target Q factor is achieved based on the material of the dielectric resonator element, the height to which each pillar-shaped dielectric member extends from the surface 890, and the width of each pillar-shaped dielectric member.

The dielectric resonator elements shown in FIG. 1 include elongated dielectric walls with channels formed therebetween and so are arranged in a one-dimensional array. In some embodiments, multiple one-dimensional arrays similar to the array illustrated in FIG. 1 can be arranged to form a two-dimensional array. In contrast, the pillar- or tower-shaped dielectric resonator elements 801-896 shown in FIG. 8 can be arranged in a two-dimensional array on a single substrate to provide two dimensions of control of the optical reflection pattern. That is, each of the dielectric resonator elements 801-896 is subwavelength in nature and a pattern of applied voltage differentials can be used to select a pattern of refractive indices of each of the subwavelength devices. Accordingly, a target reflection pattern can be selected based on the pattern of applied voltage differentials.

Figure 9:
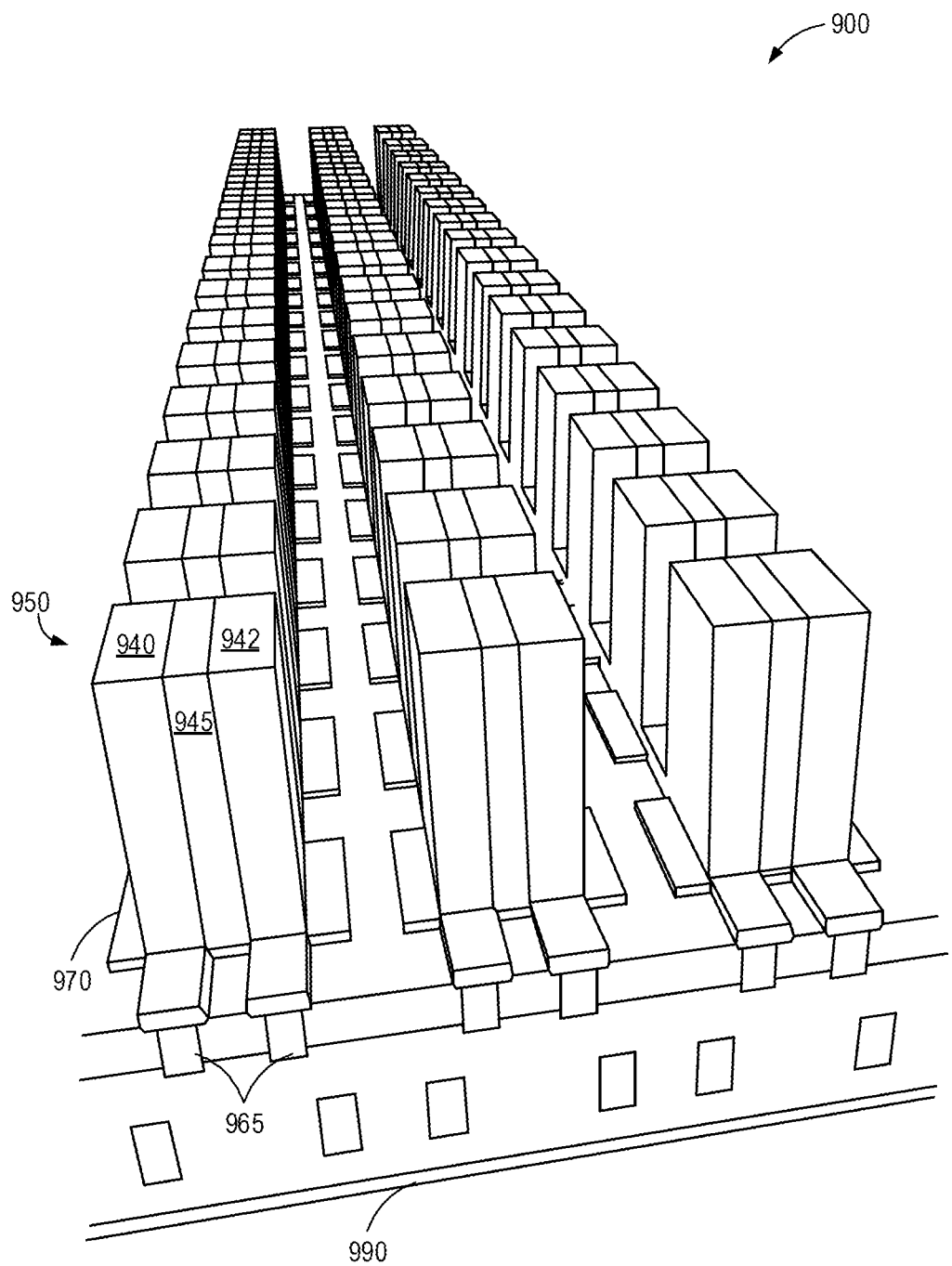
FIG. 9 illustrates another simplified close-up view of a plurality of dielectric resonator elements, including optically reflective patches, electrical connections, and an underlying control matrix for applying voltage differentials.

FIG. 9 illustrates a different example of a simplified, close-up cut-away view of a plurality of dielectric resonator elements 900 on a surface 990, including dielectric resonator element 950. Each dielectric resonator element, including dielectric resonator element 950 comprises paired dielectric members 940 and 942 with a voltage-controlled adjustable refractive index material 945 disposed therebetween. Electrical connections 965 allow for a controller to apply unique voltage differential to each of the plurality of dielectric resonator elements.

An optically reflective patch 970 is positioned beneath each dielectric resonator element as well. In various embodiments, an insulating layer may separate the paired dielectric members 940 and 942 from the optically reflective patch 970 in embodiments in which it is electrically conductive (e.g., copper, gold, silver, etc.).

Figure 10:
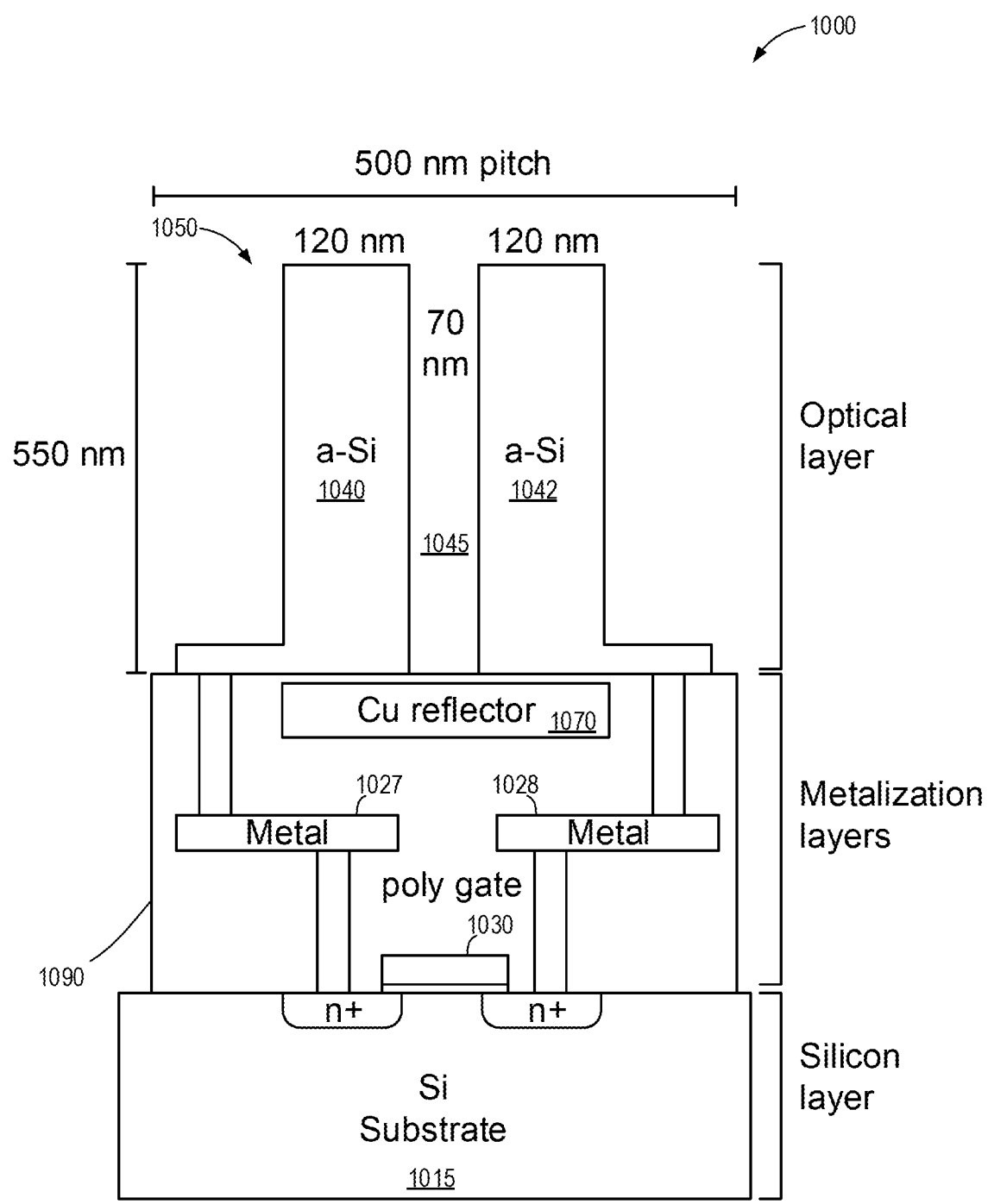
FIG. 10 illustrates a simplified block diagram of a dielectric resonator element with an underlying optically reflective patch, electrical connections, control electronics, and a substrate.

FIG. 10 illustrates a simplified block diagram 1000 of a dielectric resonator element 1050 with an underlying optically reflective patch 1070, electrical connections 1027 and 1028, control electronics (shown as poly gate 1030 and doped silicon substrate 1015). In the illustrated embodiment, specific example dimensions are provided but it is appreciated that the dimensions may be varied for a particular application and/or operational bandwidth. In the illustrated example, an array of dielectric resonator elements 1050 may be arranged with a 500-nanometer pitch.

Each dielectric resonator element 1050 may include opposing amorphous silicon pillars 1040 and 1042 that have a width of approximately 120 nanometers and extend from the surface 1090 by approximately 550 nanometers. An adjustable (e.g., voltage-tunable or heat-tunable, or phase-tunable) refractive index material 1045 may be positioned within a gap between the amorphous silicon pillars 1040 and 1042. The gap between the amorphous silicon pillars 1040 and 1042 may be approximately 70 nanometers.

In some embodiments, the copper reflector 1070 may be a copper layer that extends across the entire surface. In such embodiments, the metal 1027 and 1028 that connect to the amorphous silicon pillars 1040 and 1042 may pass through insulated thru-bores in the copper reflector 1070.

In addition to materials compatibility with CMOS processes, the geometry of the metasurface elements is such that it can be fabricated monolithically over the control electronics. In one approach, each element is addressed individually, and the individual addressing may be achieved with an active or passive matrix addressing scheme, depending on the tuning mechanism utilized. In the case of liquid crystals, passive matrix addressing can be utilized since the molecular orientation has some memory, on the scale of several milliseconds. Passive matrix addressing is also compatible with chalcogenide glasses, since they have long-term memory.

In other embodiments, active matrix addressing may be preferable for implementations that use electro-optical polymers, as they have an extremely fast (several fs) response time. Thus, each element can include a storage capacitor or similar structure to keep the applied voltage. In at least one illustrative embodiment described herein, the element pitch is approximately 700 nanometers, which is much larger than state-of-the-art DRAM and SRAM memory cells, and is also on a similar scale to pixel pitch of modern CMOS imaging sensors, which have a typical pixel size of 1000 nanometer.

Some embodiments may be created via a fabrication process suitable for large-scale commercial fabrication. For example, a first step may include fabricating CMOS transistors in the crystalline silicon wafer. Then the transistors can be connected to the word and bit lines of the active or passive matrix using a patterned metallization layer. During the metallization steps, metallic vias can also be formed to each control capacitor, which will later connect to dielectric pillars. The metal interconnect and via layers can be planarized with oxide deposition followed by chemical mechanical polishing, which can achieve sub-nanometer surface flatness. Finally, the metal reflector and dielectric (e.g., silicon) pillars can be fabricated on the planarized control electronics, as described above, with each sub-pillar connected to the exposed vias.

The above-described fabrication processes are entirely CMOS compatible. As the final step, the tuning material can be integrated into the gaps between the pillars. Liquid crystals and electro-optical polymers can be deposited directly via spin coating, and will fill the cores via capillary action, so long as the surface is prepared appropriately to be either hydrophobic or hydrophilic, depending on the material. In the case of chalcogenide glass such as GST, sputtering can be employed, followed by a masked wet or dry etch to remove the GST from all areas except inside the pillar cores.

Figure 11A:
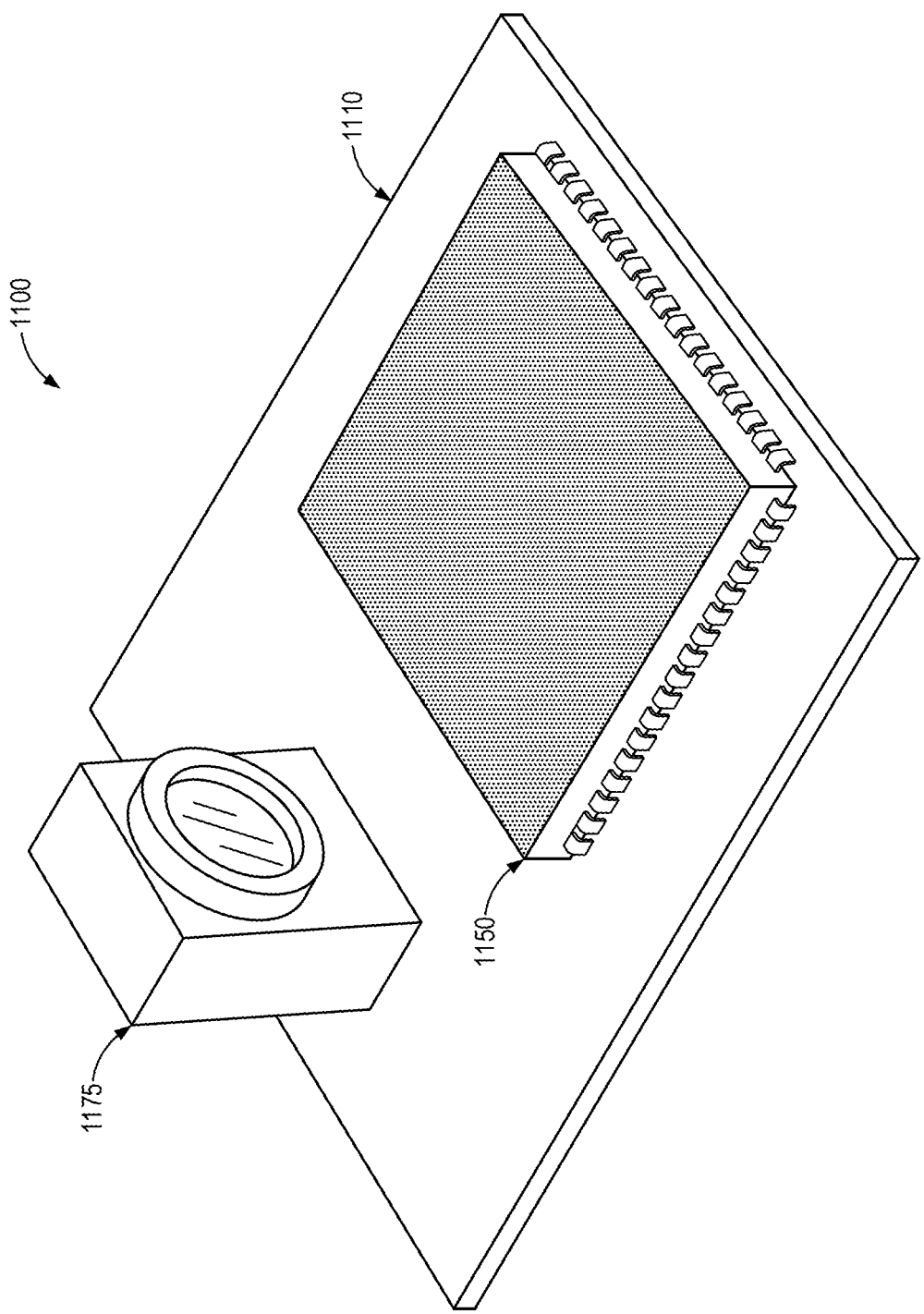
FIG. 11A illustrates an example of a tunable optical surface scattering antenna device with an optical transmitter or receiver.

FIG. 11A illustrates an example of a system 1100 that includes a tunable optical surface scattering antenna device 1150 with an optical transmitter and/or receiver 1175 mounted to a base 1110. The optical transmitter and/or receiver 1175 may be configured to transmit optical radiation to and/or receive optical radiation from the tunable optical surface scattering antenna device 1150 at a grazing angle of incidence (e.g., between 60 and 89 degrees). The tunable optical surface scattering antenna device 1150 may be configured according to any combination of embodiments described herein.

For instance, the tunable optical surface scattering antenna device 1150 may be configured with a plurality of elongated dielectric resonator elements arranged in a one-dimensional array with paired elongated wall-like dielectric members with adjustable refractive index material disposed therebetween. Alternatively, the tunable optical surface scattering antenna device 1150 may be configured with a plurality of pillar-like dielectric resonator elements arranged in a two-dimensional array with unpaired pillar-shaped dielectric members with adjustable refractive index material disposed therebetween.

Figure 11B:
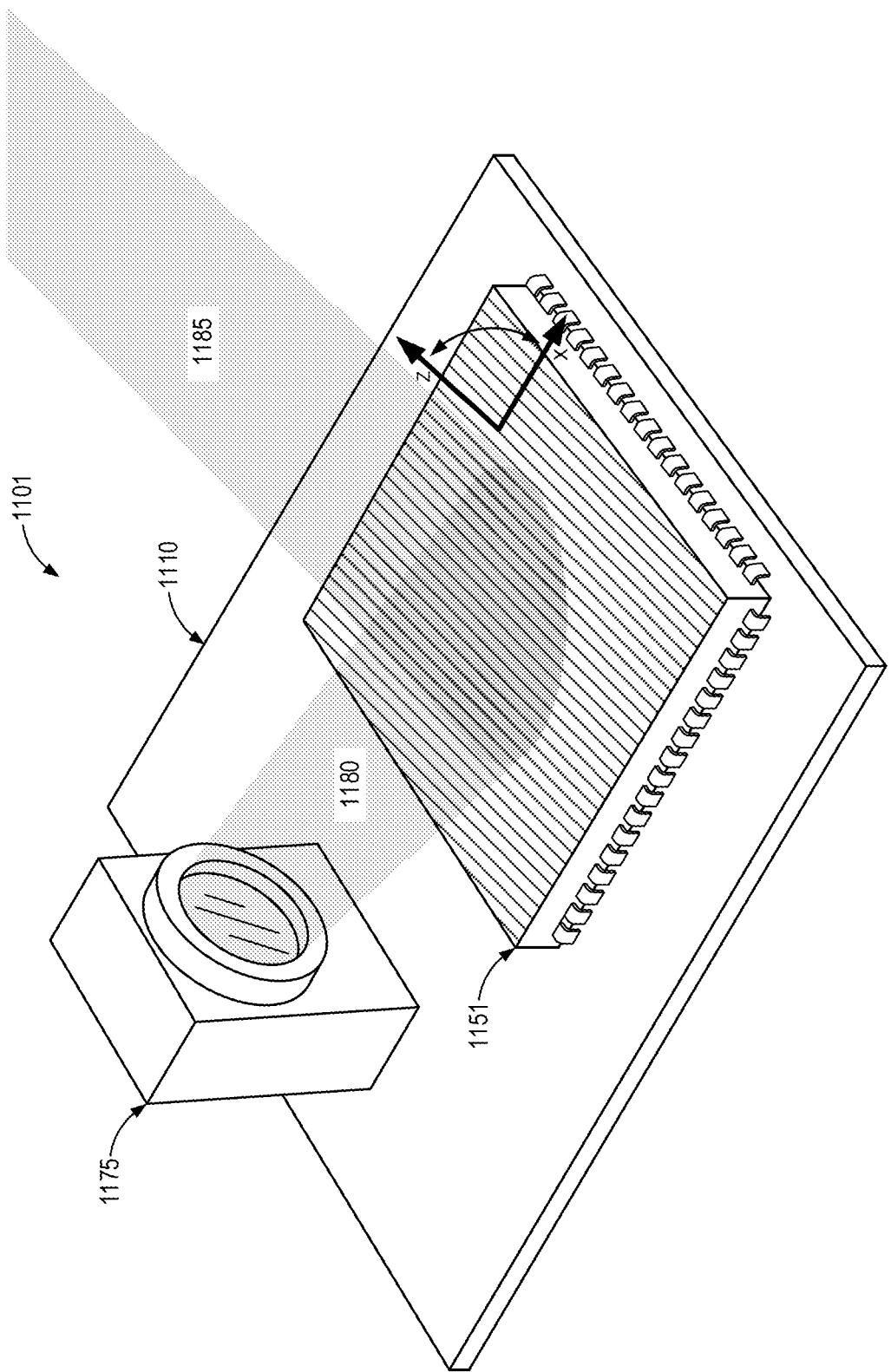
FIG. 11B illustrates the transmitter (or receiver) transmitting (or receiving) optical radiation via a steerable optical beam from the tunable optical surface that includes elongated wall dielectric members.

FIG. 11B illustrates the transmitter 1175 (or receiver) transmitting (or receiving) optical radiation 1180 at a grazing angle via a reflected, steerable optical beam 1185 from the tunable optical surface 1151 that includes elongated wall dielectric members. The beam 1185 may be adjusted in one direction as shown by the X-Z arrows.

Figure 11C:
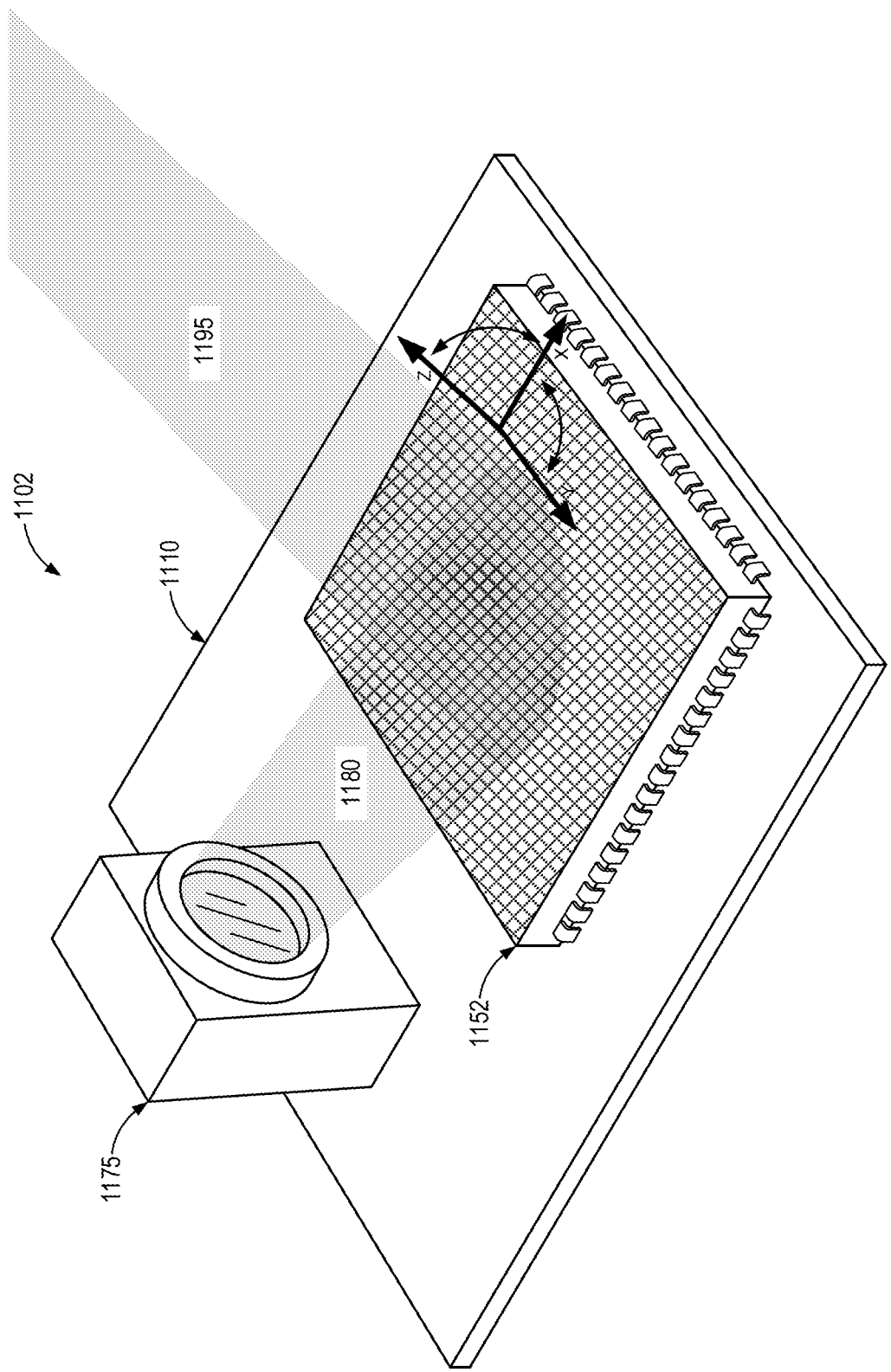
FIG. 11C illustrates the transmitter (or receiver) transmitting (or receiving) optical radiation via a multi-directional steerable optical beam from the tunable optical surface that includes pillar dielectric members.

FIG. 11C illustrates the transmitter 1175 (or receiver) transmitting (or receiving) optical radiation 1180 at a grazing angle via a reflected, multi-directional steerable optical beam 1195 from the tunable optical surface 1152 that includes pillar dielectric members arranged in a two-dimensional array.

Figure 12:
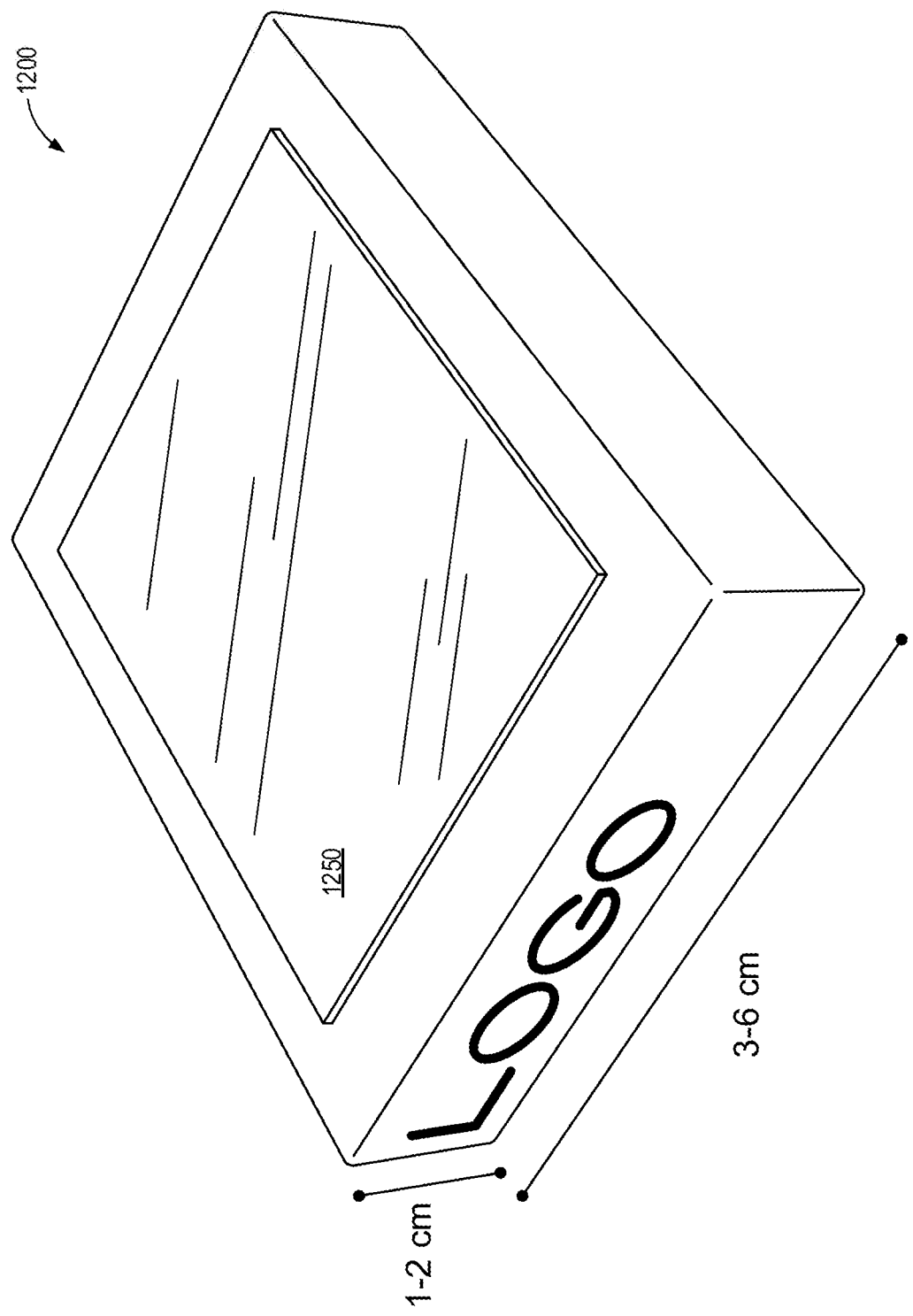
FIG. 12 illustrates an example embodiment of a packaged solid-state steerable optical beam antenna system with an optically transparent window.

FIG. 12 illustrates an example embodiment of a packaged solid-state steerable optical beam antenna system 1200 with an optically transparent window 1250. The illustrated embodiment may include a transmitter, receiver, and/or a transceiver within the package that are in optical communication with one or more tunable optical surface scattering antenna devices. For example, a transceiver may be paired with a single tunable optical surface scattering antenna device. Alternatively, the package may include a discrete transmitter and a discrete receiver that are each in communication with their own tunable optical surface scattering antenna device—one for receiving and one for transmitting. The package may protect the sensitive components and the optically transparent window 1250 may allow for a steerable beam to be steered at various angles in one or two dimensions, depending on the type of tunable optical surface scattering antenna device employed.

This disclosure has been made with reference to various exemplary embodiments, including the best mode. However, those skilled in the art will recognize that changes and modifications may be made to the exemplary embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. This disclosure should, therefore, be determined to encompass at least the following claims.

What is claimed is:

1. An apparatus, comprising:
  a surface;
  a plurality of adjustable dielectric resonator elements arranged on the surface with inter-element spacings less than an optical operating wavelength,
  wherein each adjustable dielectric resonator element of the plurality of adjustable dielectric resonator elements comprises:
    a first dielectric member extending from the surface;
    a second dielectric member extending from the surface; and
    an adjustable refractive index material disposed in a gap between the first and second dielectric members that is tunable to adjust an optical reflection phase of a corresponding adjustable dielectric resonator element.

2. The apparatus of claim 1, wherein the surface comprises an optically reflective surface to reflect optical electromagnetic radiation within an operational bandwidth that includes the optical operating wavelength.

3. The apparatus of claim 2, further comprising a non-conductive layer separating the plurality of dielectric resonator elements from the optically reflective surface.

4. The apparatus of claim 3, wherein the non-conductive layer comprises a silicon dioxide layer.

5. The apparatus of claim 1, wherein the first dielectric member comprises a first elongated wall, the second dielectric member comprises a second elongated wall that is substantially parallel to the first wall, and the adjustable refractive index material is disposed within a channel defined by the first and second walls.

6. The apparatus of claim 5, wherein each of the first and second elongated walls have a length corresponding to an Nth harmonic mode of frequencies within an optical operating bandwidth, such that N antinodes can be realized along the length of the gap between the first and second elongated walls, where N is an integer.

7. The apparatus of claim 1, wherein the first dielectric member comprises a first pillar, the second dielectric member comprises a second pillar, and the adjustable refractive index material is disposed between the first and second pillars.

8. The apparatus of claim 1,
  wherein the first dielectric member and the second dielectric member are spaced from one another to form a channel therebetween and the electrically adjustable refractive index material is disposed within at least a portion of the channel, the apparatus further comprising electrical contacts to receive an applied voltage differential to the first and second dielectric members,
  wherein application of a first voltage differential to the first and second dielectric members corresponds to a first reflection phase, and
  wherein application of a second voltage differential to the first and second dielectric members corresponds to a second reflection phase.

9. The apparatus of claim 1, wherein the surface comprises an electrically conductive surface.

10. The apparatus of claim 9, wherein the electrically conductive surface and the plurality of dielectric resonator elements define a metasurface.

11. The apparatus of claim 10, wherein the electrically conductive surface comprises a metal surface.

12. The apparatus of claim 11, wherein the metal surface comprises a copper surface.

13. The apparatus of claim 1, wherein the surface comprises a plurality of patches.

14. The apparatus of claim 13, wherein each of the plurality of patches comprises a metal patch.

15. The apparatus of claim 13, wherein each of the patches has a dimension corresponding to a dimension of the dielectric resonator elements.

16. The apparatus of claim 15, wherein there is one patch beneath each of the plurality of dielectric resonator elements.

17. The apparatus of claim 13, wherein each of the plurality of patches is formed on a substrate.

18. The apparatus of claim 17, wherein each of the plurality of patches is substantially reflective at an operational bandwidth.

19. The apparatus of claim 17, wherein the substrate is not substantially reflective within an operational bandwidth.

20. The apparatus of claim 1, wherein the inter-element spacing between adjacent dielectric resonator elements is less than one wavelength of a smallest wavelength within the operational bandwidth.

21. The apparatus of claim 1, wherein
  the first dielectric member is a first elongated wall,
  the second dielectric member is a second elongated wall, and
  the adjustable refractive index material is disposed within a channel defined between the first and second elongated walls.

22. The apparatus of claim 21, wherein at least some of the dielectric resonator elements share a dielectric member formed as an elongated wall with another of the dielectric resonator elements.

23. The apparatus of claim 22, wherein any two dielectric resonator elements are formed as three elongated walls that are substantially parallel to one another to form two channels within which adjustable refractive index material is disposed.

24. The apparatus of claim 21, wherein the first and second elongated walls of each of the dielectric resonator elements are paired elongated walls that are unshared with any other dielectric resonator element, such that the number of elongated walls is two times the number of dielectric resonator elements.

25. The apparatus of claim 24, wherein the distance between dielectric resonator elements is greater than the distance between paired elongated walls.

26. The apparatus of claim 21, wherein the dielectric resonator elements are arranged in a one-dimensional array perpendicular to the elongated walls.

27. The apparatus of claim 21, wherein each of the elongated walls extends between opposing edges of the surface.

28. The apparatus of claim 1, wherein the dielectric resonator elements are arranged in rows and columns to form an M×N array of dielectric resonator elements, where M corresponds to the number of rows and N corresponds to the number of columns.

29. The apparatus of claim 1, wherein
the first dielectric member is a first pillar having a substantially rectangular base,
the second dielectric member is a second pillar having a substantially rectangular base, and
the adjustable refractive index material is disposed between the first and second pillars.

30. The apparatus of claim 29, wherein the dielectric resonator elements are arranged in rows and columns to form an M×N array of dielectric resonator elements, where M corresponds to the number of rows and N corresponds to the number of columns.

31. The apparatus of claim 30, further comprising a matrix circuitry indexed by row and column to address each of the dielectric resonator elements.

32. The apparatus of claim 29, wherein each of the first and second pillars are substantially cuboid in shape.

33. The apparatus of claim 1, wherein the gap between the first dielectric member and the second dielectric member corresponds to a fundamental harmonic mode of frequencies within an optical operating bandwidth.

34. The apparatus of claim 1, wherein the gap between the first and second dielectric members corresponds to a second order harmonic mode of frequencies within an optical operating bandwidth, such that two antinodes can be realized within the adjustable refractive index material between the first and second dielectric members.

35. The apparatus of claim 34, wherein each of the first and second dielectric members extends from the surface to a height corresponding to the second order harmonic mode of frequencies within the optical operating bandwidth, such that two antinodes can be realized within the gap between the surface and tops of the first and second dielectric members.

36. The apparatus of claim 1, wherein each of the first and second dielectric members extends from the surface to a height corresponding to an Nth order harmonic mode of frequencies within an optical operating bandwidth, such that N antinodes can be realized within the gap between the surface and tops of the first and second dielectric members.

37. The apparatus of claim 1, further comprising a controller to selectively apply voltage differentials to the first and second dielectric members of each of the dielectric resonator elements, wherein each of a plurality of selectable voltage differentials corresponds to (i) an index of refraction of the adjustable refractive index material, and (ii) a reflection phase of each of the respective dielectric resonator elements.

38. The apparatus of claim 1, wherein an operational bandwidth of the dielectric resonator elements comprises a portion of the infrared light spectrum.

39. The apparatus of claim 1, wherein the surface comprises a dielectric substrate with a plurality of copper patches thereon, wherein one of the copper patches is positioned beneath each of the dielectric resonator elements.

40. The apparatus of claim 1, wherein the inter-element spacing between adjacent dielectric resonator elements is less than one-half of a smallest wavelength within the operational bandwidth.

41. The apparatus of claim 1, wherein the inter-element spacing between adjacent dielectric resonator elements is less than one-fifth of a smallest wavelength within the operational bandwidth.

42. The apparatus of claim 1, wherein the inter-element spacing between adjacent dielectric resonator elements is between approximately one-half and one-tenth of a smallest wavelength within the operational bandwidth.

* * * * *